(12) United States Patent
Wang et al.

(10) Patent No.: US 11,764,262 B2
(45) Date of Patent: *Sep. 19, 2023

(54) MULTI-GATE DEVICE WITH AIR GAP SPACER AND FABRICATION METHODS THEREOF

(71) Applicant: Taiwan Semiconductor Manufacturing Co., Ltd., Hsin-Chu (TW)

(72) Inventors: Pei-Yu Wang, Hsinchu (TW); Wei Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

This patent is subject to a terminal disclaimer.

(21) Appl. No.: 17/515,674

(22) Filed: Nov. 1, 2021

(65) Prior Publication Data
US 2022/0059652 A1 Feb. 24, 2022

Related U.S. Application Data

(63) Continuation of application No. 16/582,694, filed on Sep. 25, 2019, now Pat. No. 11,177,344.

(51) Int. Cl.
| | |
|---|---|
| *H01L 29/06* | (2006.01) |
| *H01L 29/66* | (2006.01) |
| *H01L 21/306* | (2006.01) |
| *H01L 29/423* | (2006.01) |
| *H01L 29/08* | (2006.01) |
| *H01L 29/10* | (2006.01) |
| *H01L 29/45* | (2006.01) |

(Continued)

(52) U.S. Cl.
CPC .... *H01L 29/0673* (2013.01); *H01L 21/02532* (2013.01); *H01L 21/30604* (2013.01); *H01L 29/0653* (2013.01); *H01L 29/0847* (2013.01); *H01L 29/1037* (2013.01); *H01L 29/42392* (2013.01); *H01L 29/45* (2013.01); *H01L 29/665* (2013.01); *H01L 29/6653* (2013.01); *H01L 29/6656* (2013.01); *H01L 29/66545* (2013.01); *H01L 29/66553* (2013.01); *H01L 29/66636* (2013.01); *H01L 29/66795* (2013.01); *H01L 29/785* (2013.01)

(58) Field of Classification Search
CPC ........... H01L 29/0673; H01L 21/02532; H01L 29/42392; H01L 29/66795
USPC ....................................................... 257/347
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |

(Continued)

*Primary Examiner* — Quoc D Hoang
(74) *Attorney, Agent, or Firm* — HAYNES AND BOONE, LLP

(57) ABSTRACT

A semiconductor device includes first and second dielectric fins disposed above a substrate, a semiconductor channel layer sandwiched between the first and second dielectric fins, a gate structure engaging the semiconductor channel layer, a source/drain (S/D) feature abutting the semiconductor channel layer and sandwiched between the first and second dielectric fins, and an air gap sandwiched between the first and second dielectric fins. The air gap exposes a first sidewall of the S/D feature facing the first dielectric fin and a second sidewall of the S/D feature facing the second dielectric fin.

20 Claims, 29 Drawing Sheets

D-D

(51) Int. Cl.
    *H01L 29/78*     (2006.01)
    *H01L 21/02*     (2006.01)

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,548,303 B2 | 1/2017 | Lee et al. |
| 9,576,814 B2 | 2/2017 | Wu et al. |
| 10,636,891 B2 | 4/2020 | Yang et al. |
| 11,177,344 B2 * | 11/2021 | Wang ............ H01L 27/088 |
| 2013/0285116 A1 | 10/2013 | Lochtefeld et al. |
| 2018/0047615 A1 | 2/2018 | Cheng et al. |
| 2020/0312976 A1 | 10/2020 | Sung et al. |
| 2020/0357911 A1 | 11/2020 | Frougier et al. |

* cited by examiner

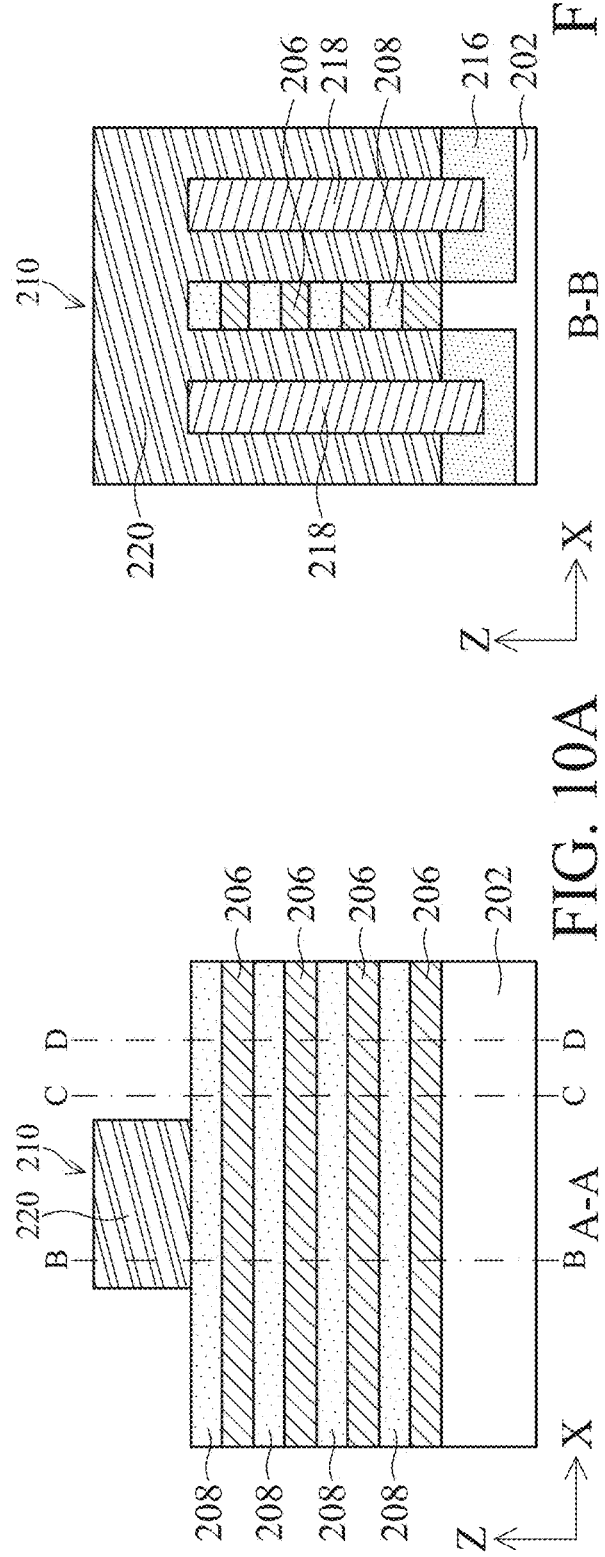

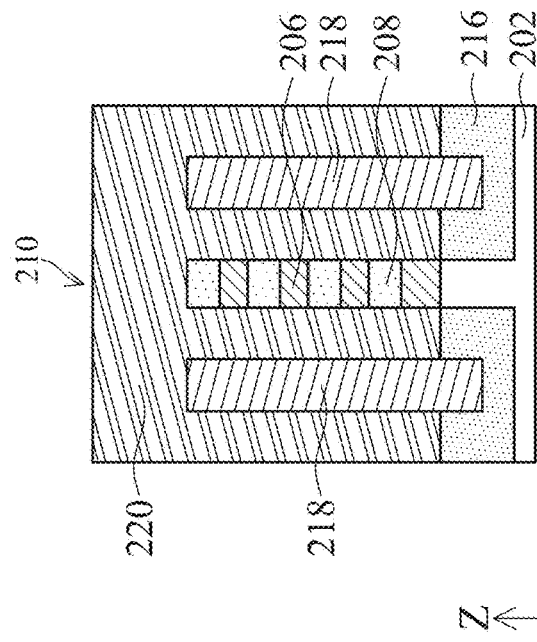
FIG. 11A
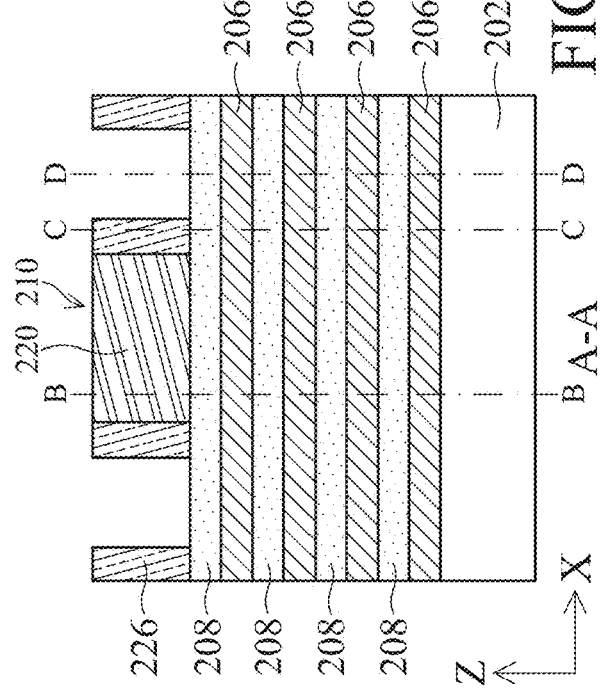
FIG. 11C
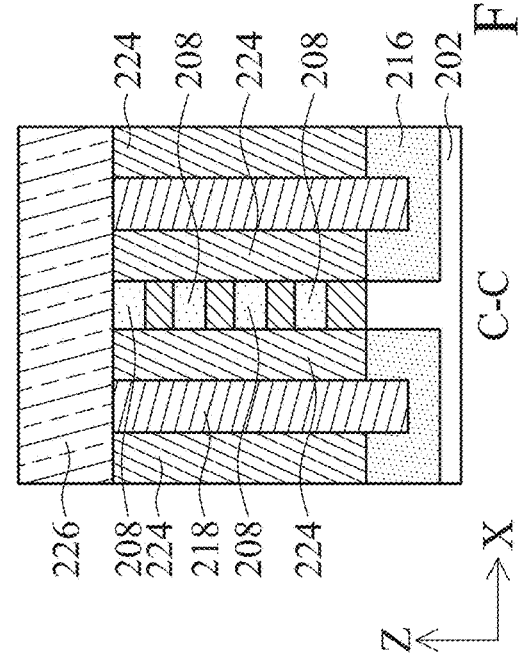
FIG. 11B
FIG. 11D

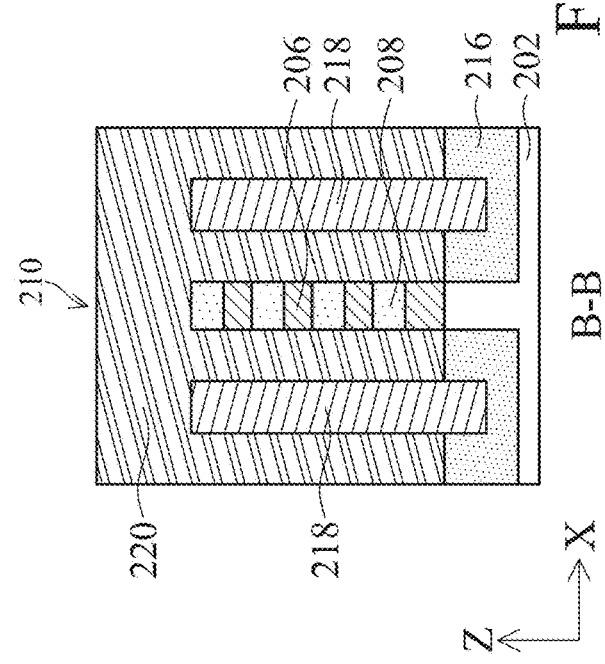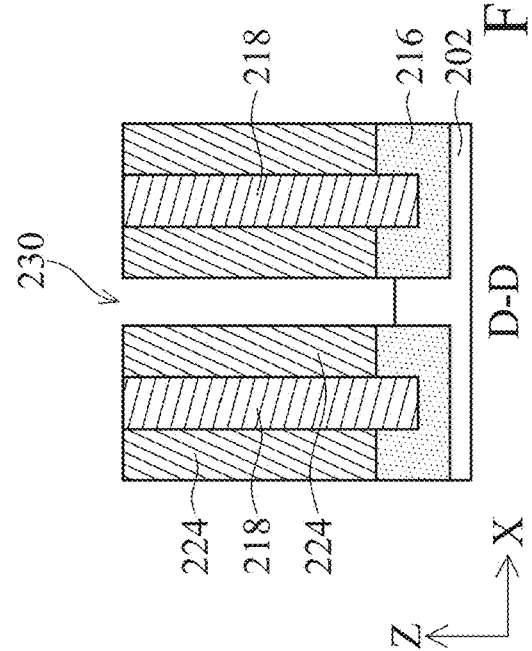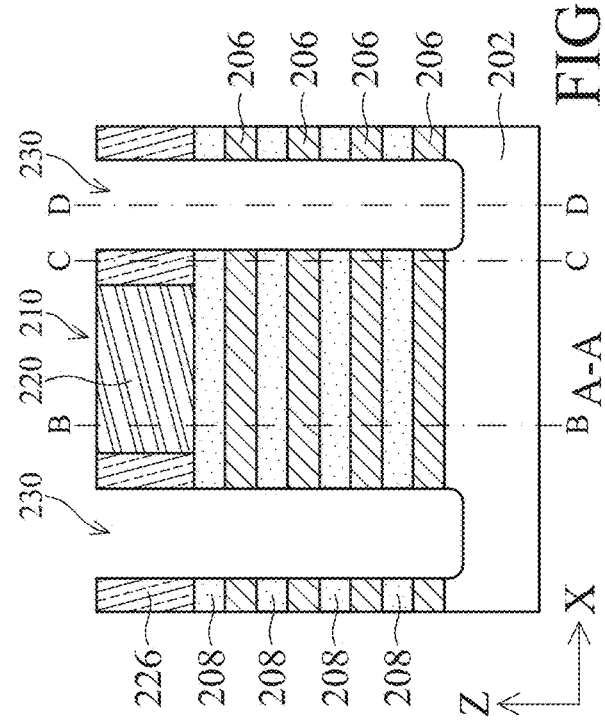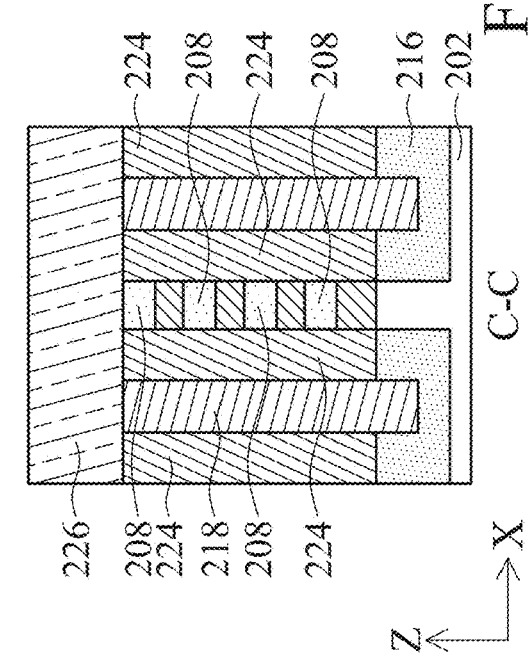

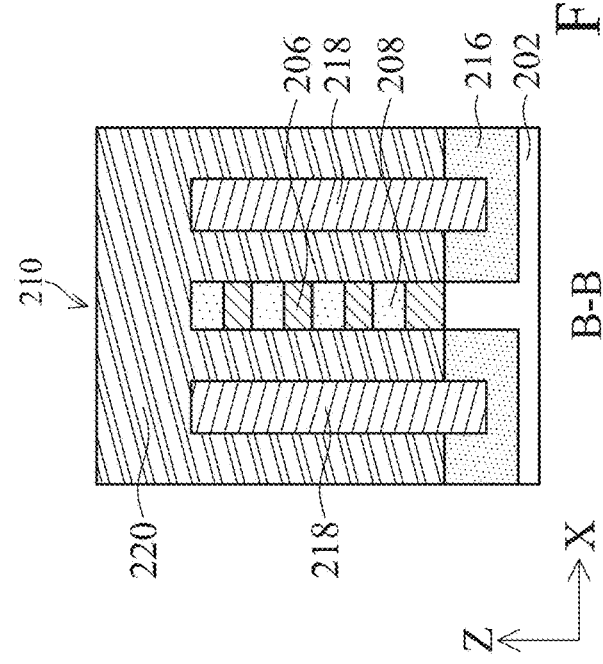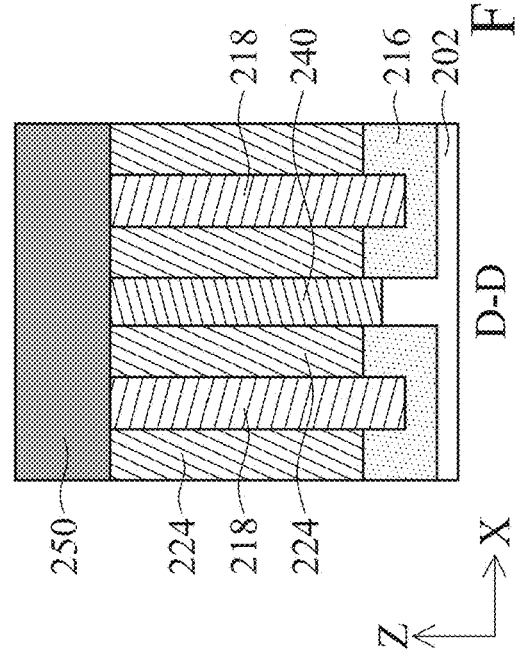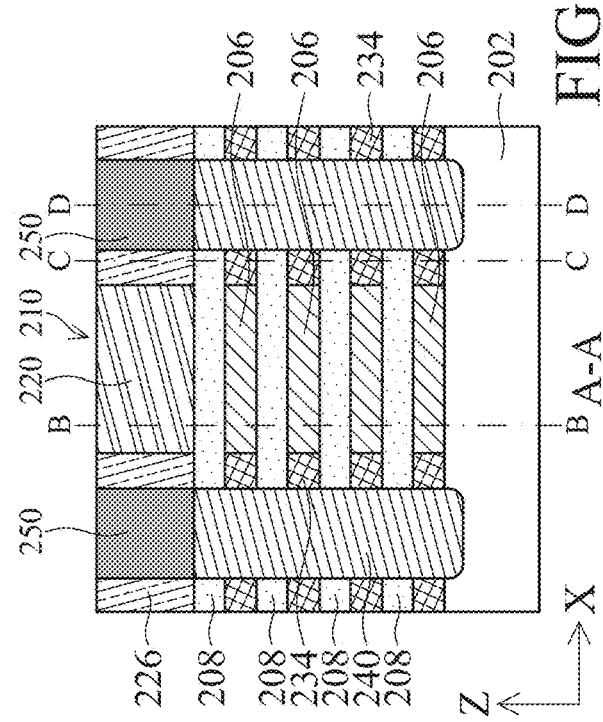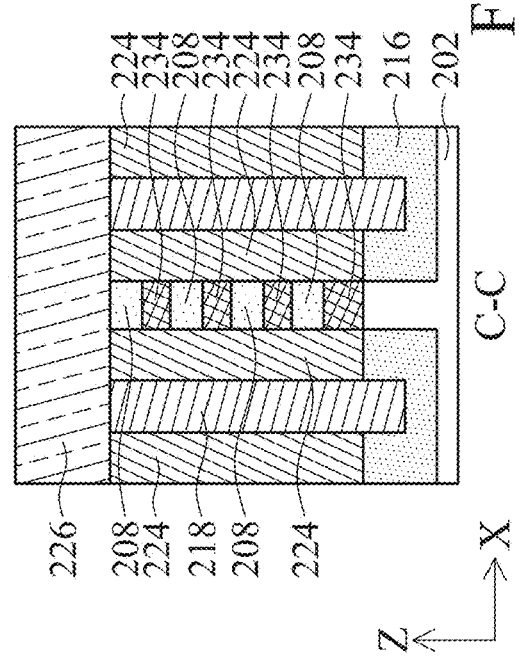

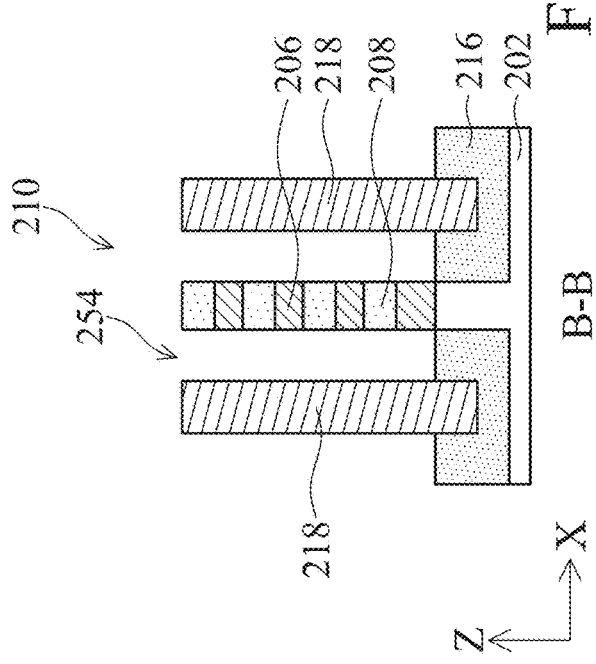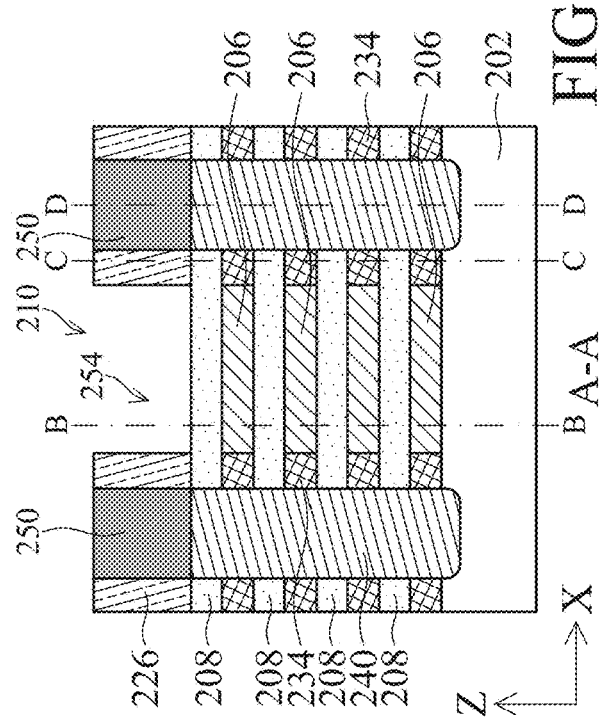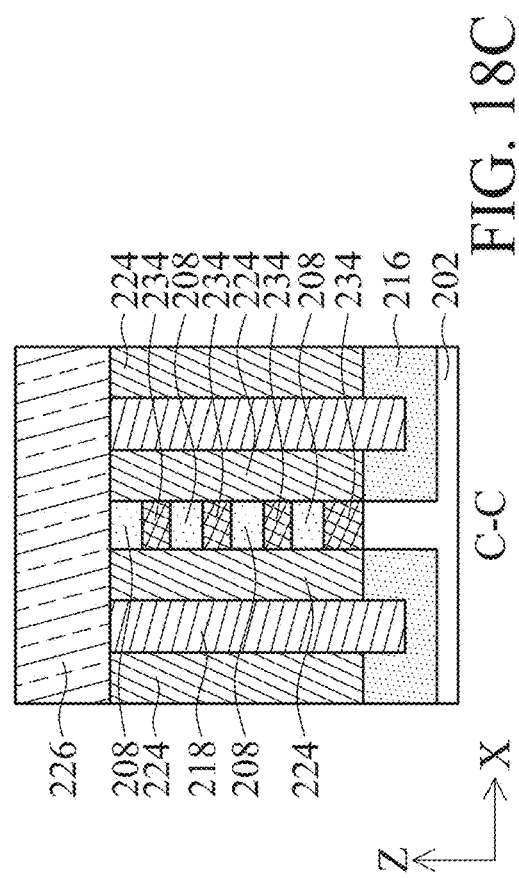

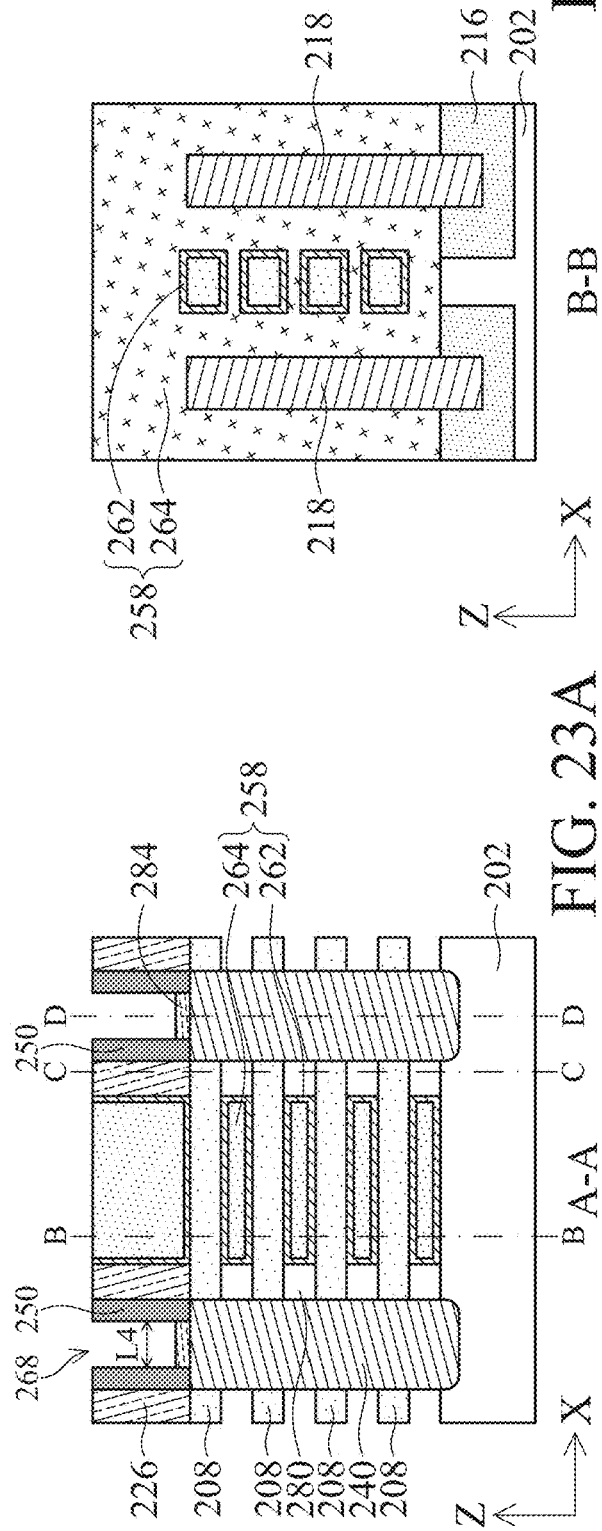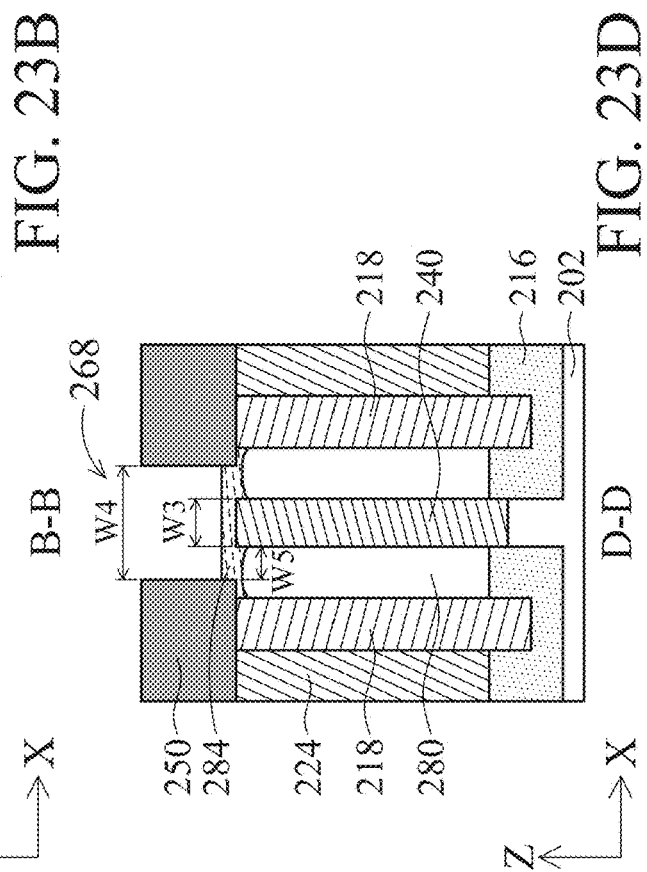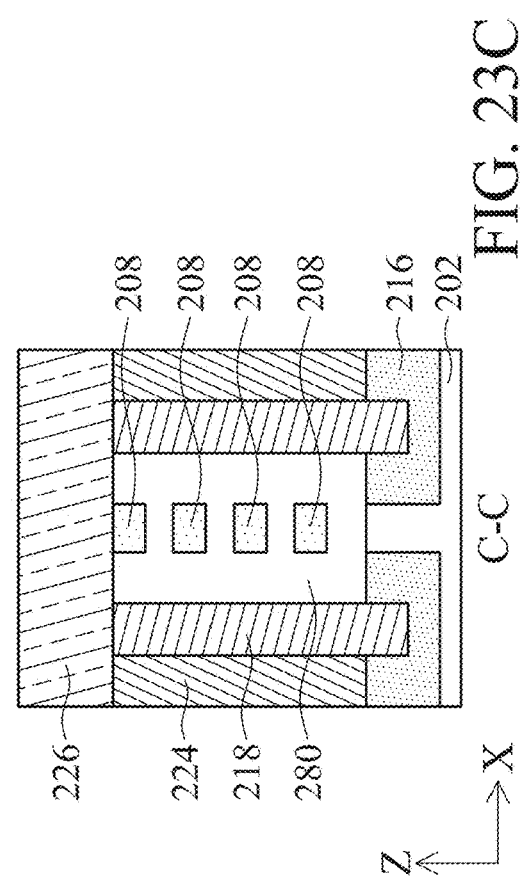
FIG. 23A
FIG. 23B
FIG. 23C
FIG. 23D

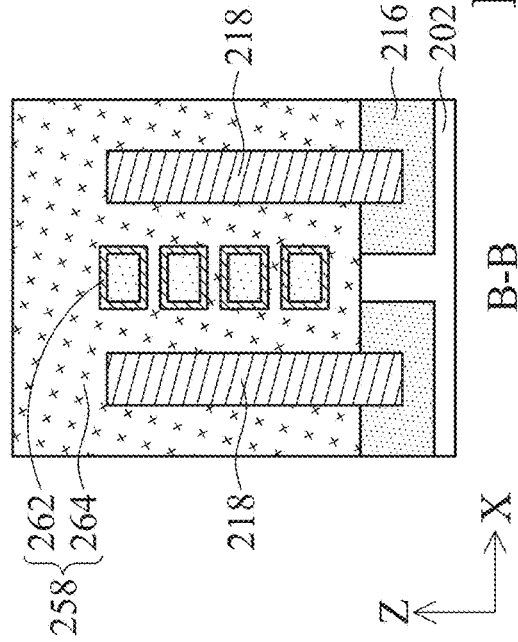
FIG. 24A
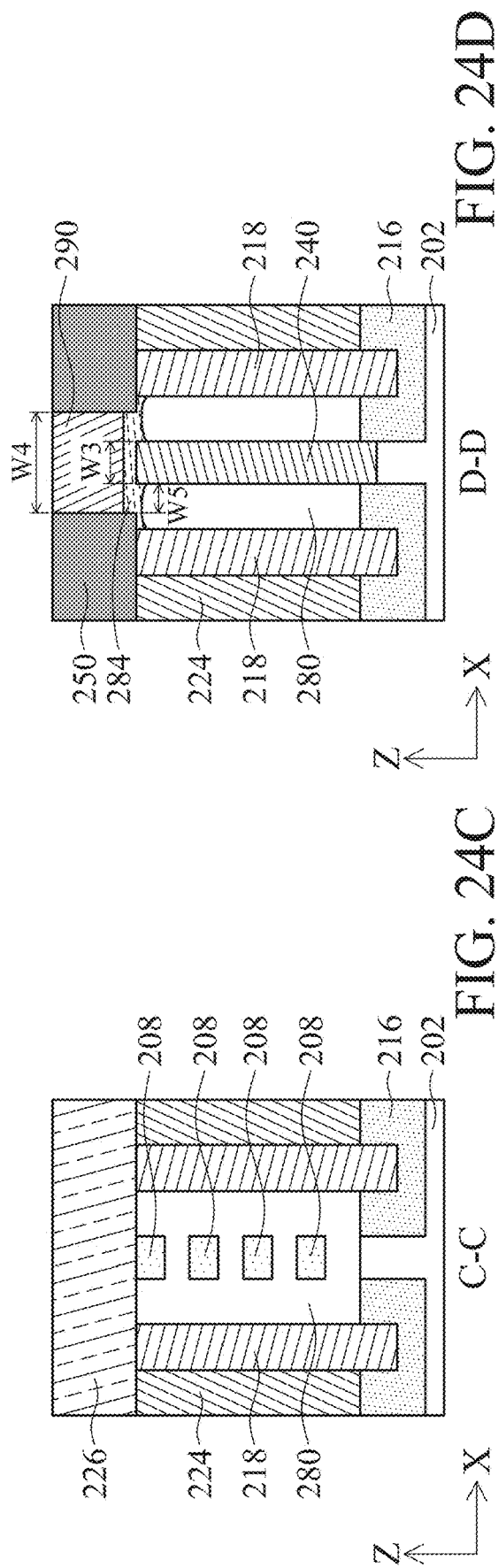
FIG. 24B
FIG. 24D
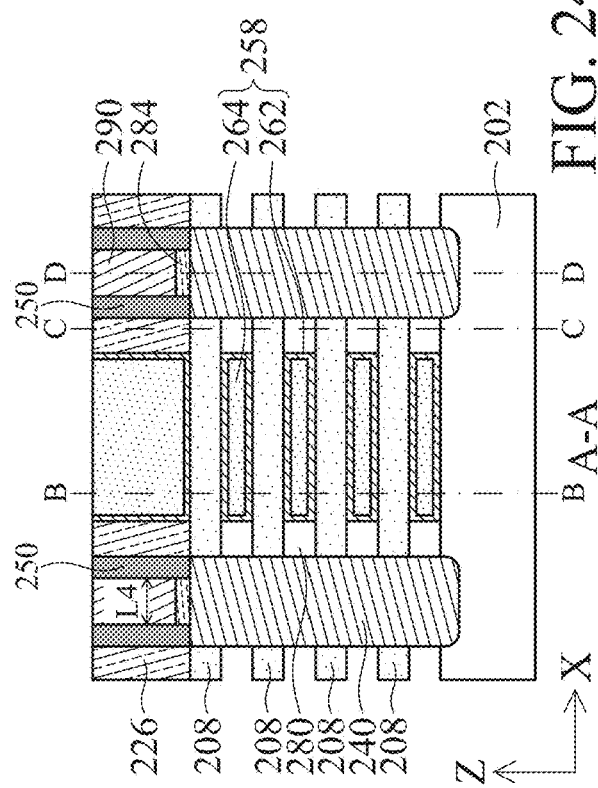
FIG. 24C

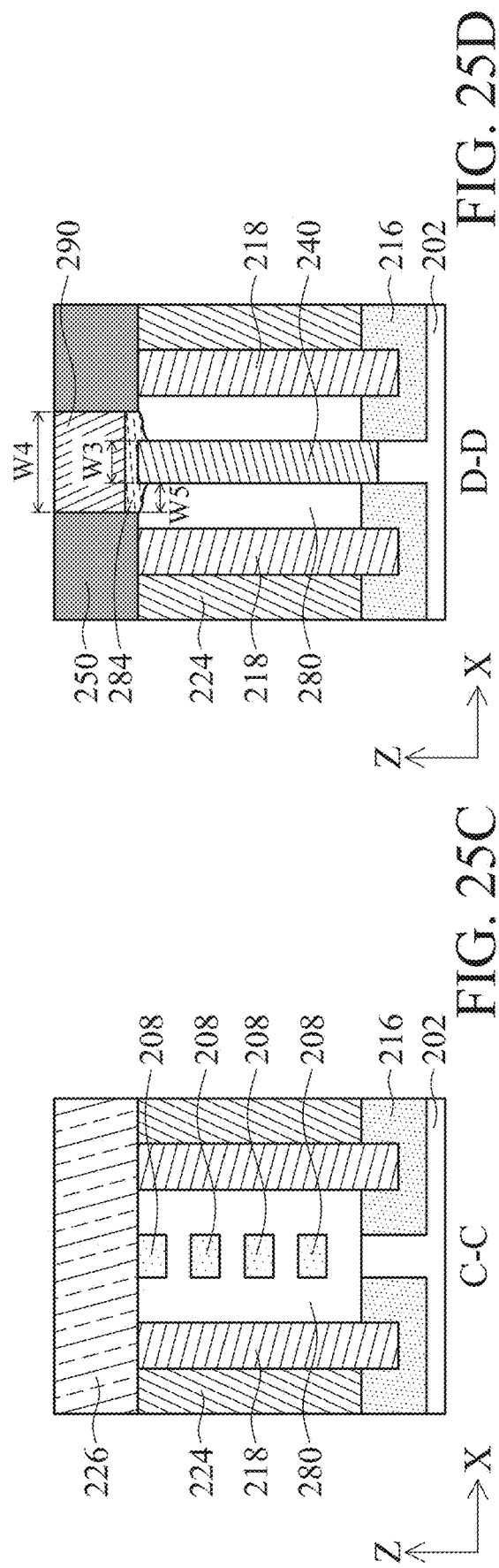
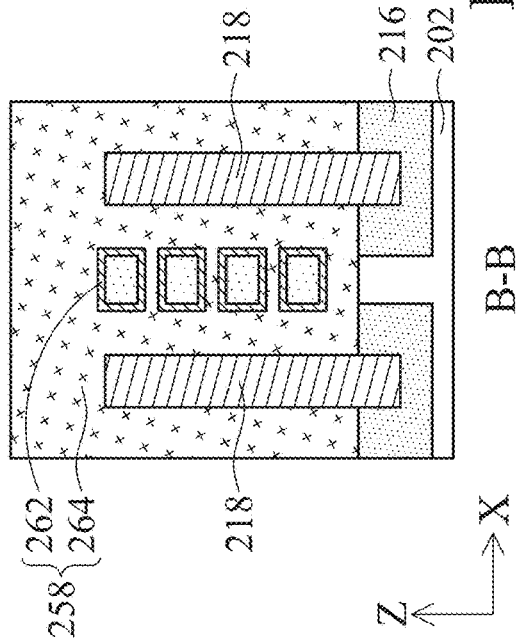
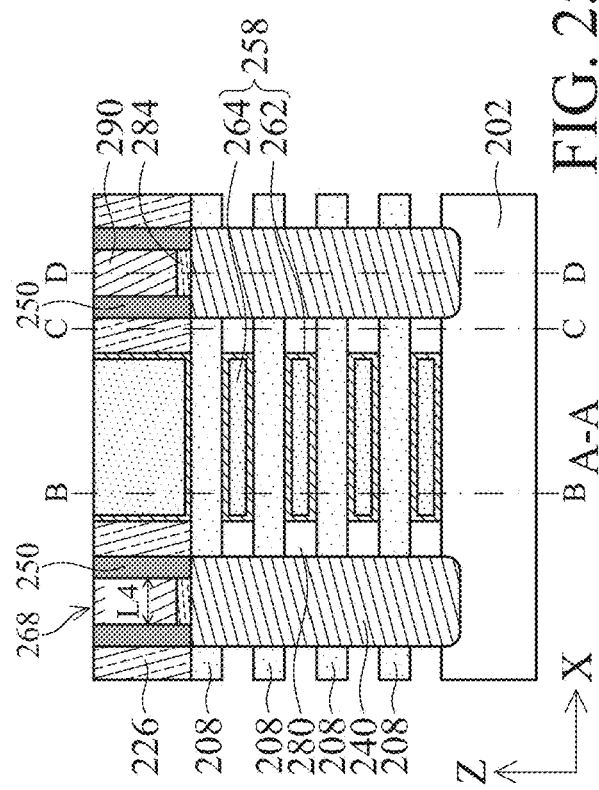
FIG. 25A  FIG. 25B  FIG. 25C  FIG. 25D

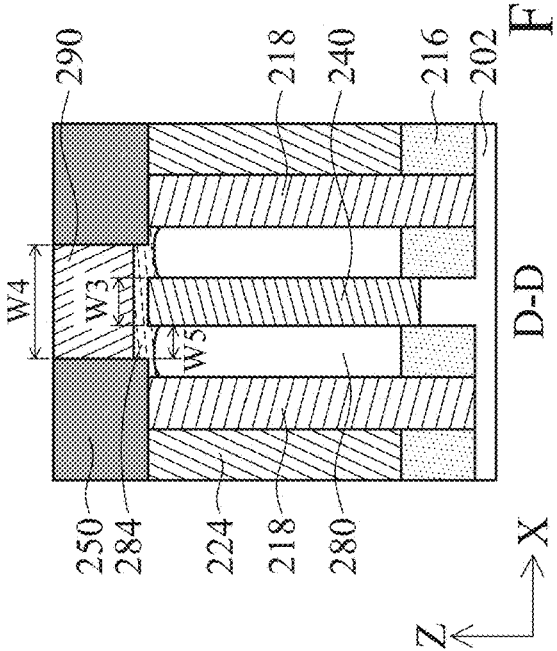
FIG. 26B
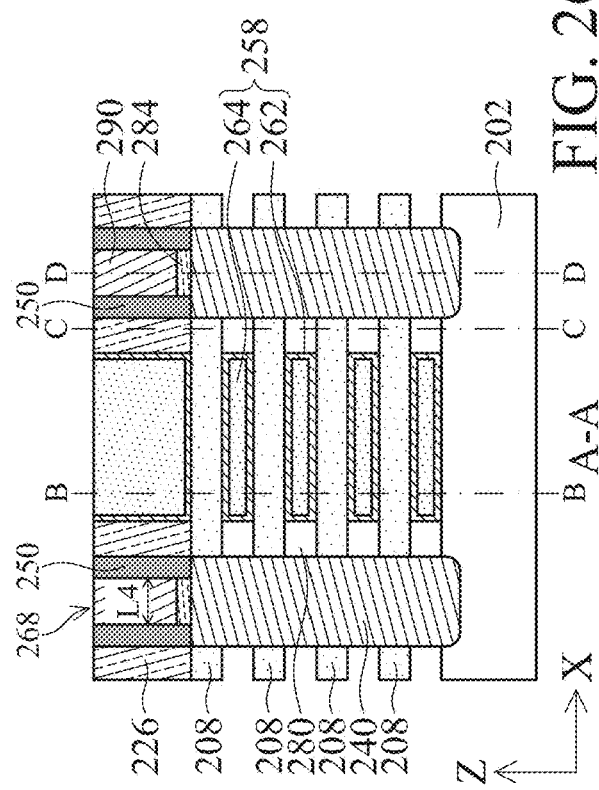
FIG. 26A
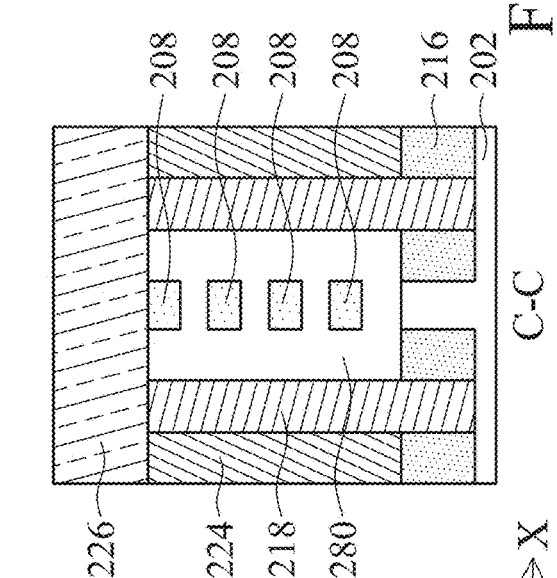
FIG. 26D
FIG. 26C

MULTI-GATE DEVICE WITH AIR GAP SPACER AND FABRICATION METHODS THEREOF

PRIORITY

This is a continuation of U.S. patent application Ser. No. 16/582,694, filed on Sep. 25, 2019, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, challenges with respect to performance of the resulting device may not be satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 9A, 10A, 11A, 12A, 13A, 14A, 15A, 16A, 17A, 18A, 19A, 20A, 21A, 22A, 23A, 24A, 25A, 26A, and 27A are corresponding fragmentary cross-sectional views of a semiconductor device in FIG. 8 taken along a first cut A-A at intermediate stages of an embodiment of the method of FIGS. 1A, 1B, and 1C in accordance with some embodiments of the present disclosure.

FIGS. 9B, 10B, 11B, 12B, 13B, 14B, 15B, 16B, 17B, 18B, 19B, 20B, 21B, 22B, 23B, 24B, 25B, 26B, and 27B are corresponding fragmentary cross-sectional views of a semiconductor device in FIG. 8 taken along a second cut B-B at intermediate stages of an embodiment of the method of FIGS. 1A, 1B, and 1C in accordance with some embodiments of the present disclosure.

FIGS. 9C, 10C, 11C, 12C, 13C, 14C, 15C, 16C, 17C, 18C, 19C, 20C, 21C, 22C, 23C, 24C, 25C, 26C, and 27C are corresponding fragmentary cross-sectional views of a semiconductor device in FIG. 8 taken along a third cut C-C at intermediate stages of an embodiment of the method of FIGS. 1A, 1B, and 1C in accordance with some embodiments of the present disclosure.

FIGS. 9D, 10D, 11D, 12D, 13D, 14D, 15D, 16D, 17D, 18D, 19D, 20D, 21D, 22D, 23D, 24D, 25D, 26D, and 27D are corresponding fragmentary cross-sectional views of a semiconductor device in FIG. 8 taken along a fourth cut D-D at intermediate stages of an embodiment of the method of FIGS. 1A, 1B, and 1C in accordance with some embodiments of the present disclosure.

DETAILED DESCRIPTION

Figure 1A:
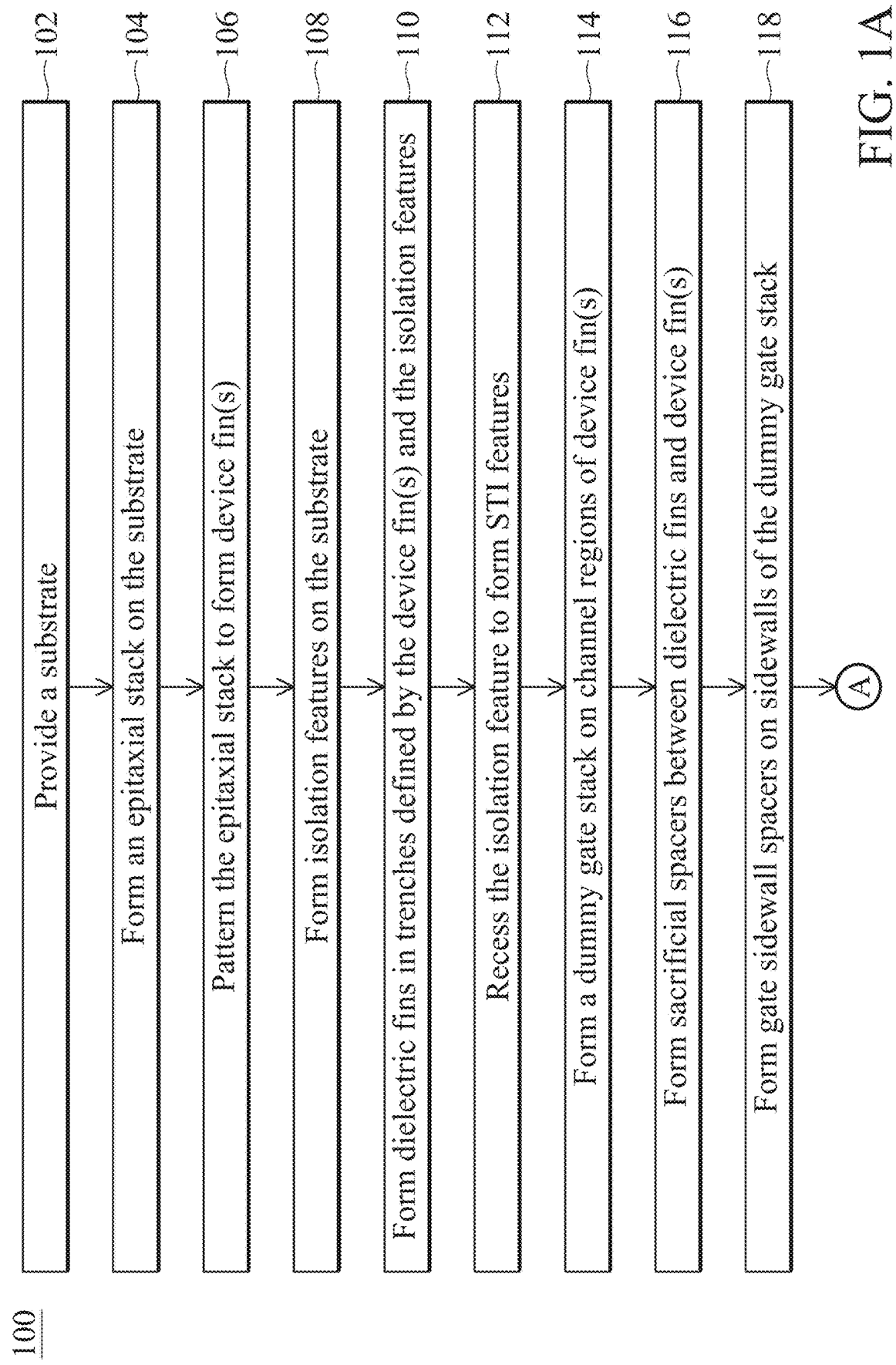
FIGS. 1A, 1B, and 1C illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

With transistor dimensions are continually scaled down to sub-10 nm technology nodes and below, it is generally desired to reduce stray capacitance among features of multi-gate transistors, such as capacitance between a gate structure and source/drain contacts, in order to increase switching speed, decrease switching power consumption, and/or decrease coupling noise of the transistors. Certain low-k materials, with a dielectric constant lower than that of silicon oxide, have been suggested as insulator materials, such as inner spacers interposing between gate structures and epitaxial source/drain (S/D) features, for providing lower relative permittivity to reduce stray capacitance. However, as semiconductor technology progresses to smaller geometries, the distances between the gate structure and source/drain contacts are further reduced, resulting in still large stray capacitance. Consequently, stray capacitance in multi-gate transistors has become more problematic. The present disclosure provides improvements in forming gate structures that do not directly contact or abut epitaxial S/D features. Further, provided are methods of forming epitaxial S/D features with confined lateral thickness, which results in further reduction of stray capacitance between epitaxial S/D features and gate structures. In some embodiments of the present disclosure, this provides a benefit of reducing the $C_{gd}$ (gate-to-drain capacitance) and $C_{gs}$ (gate-to-source capacitance) of the device. In some embodiments of the present disclosure, this provides a benefit of reducing the $C_{eff}$ (effective capacitance) of the device without obvious penalty to the $I_{eff}$ (effective current). Therefore, the speed of the circuit could be further improved.

Figure 1B:
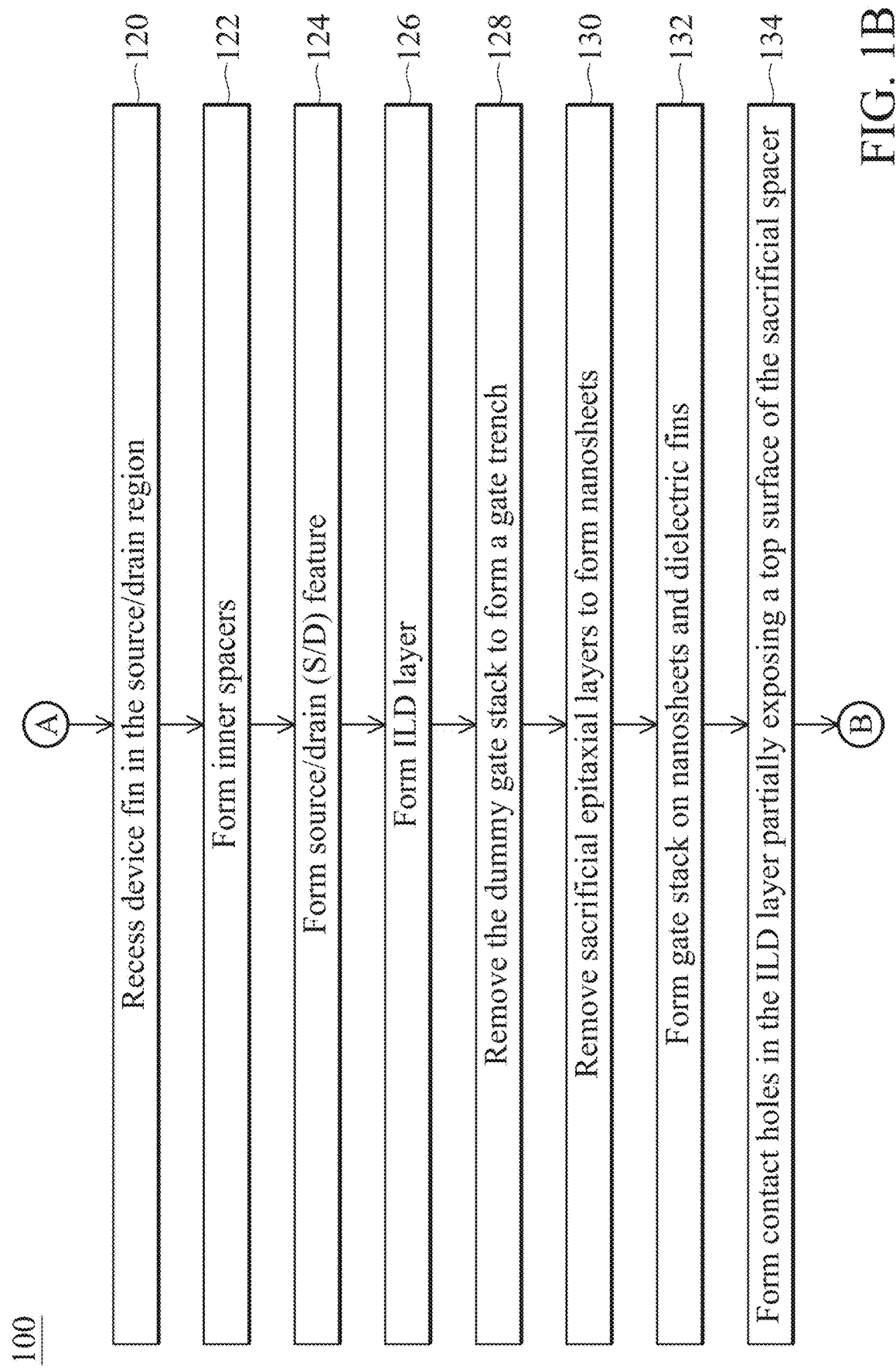
Figure 1C:
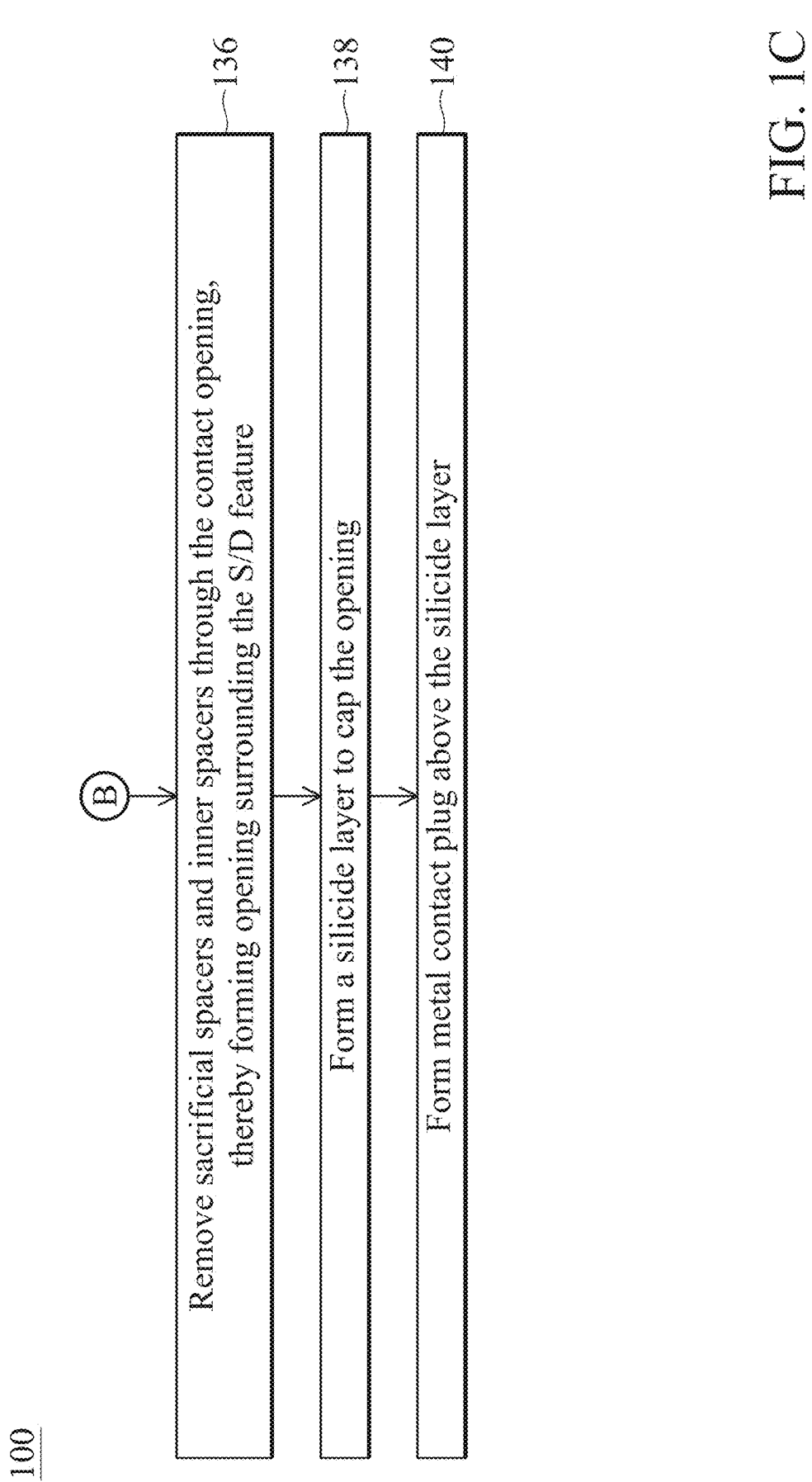

FIGS. 1A-C illustrate a flow chart of a method 100 for forming multi-gate devices according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "wire" or "semiconductor wire," which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape (e.g., nanowires) or substantially rectangular cross-section (e.g., nanosheets).

Figure 7:
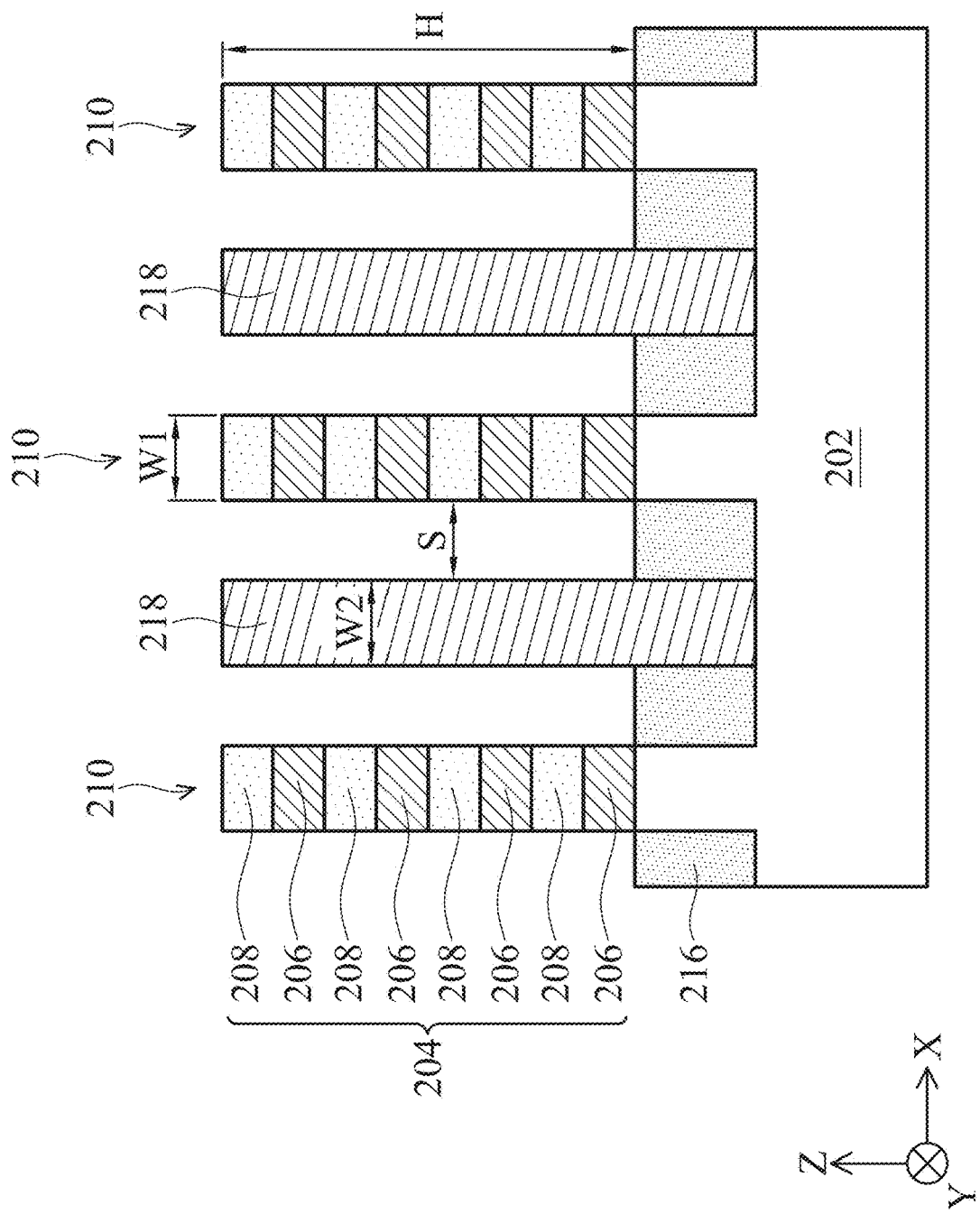
Figure 8:
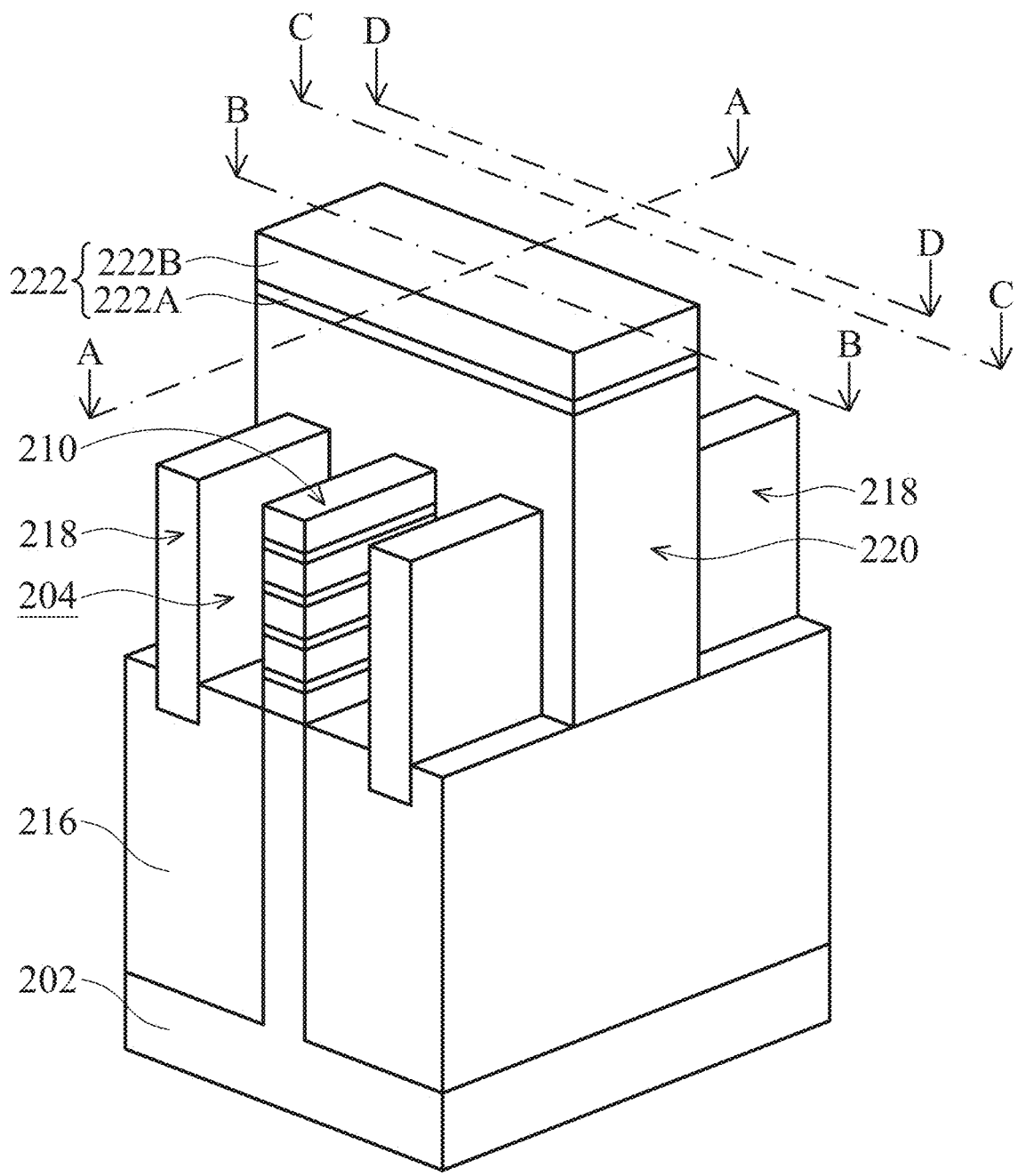
FIG. 8 illustrates a three-dimensional perspective view of an example semiconductor device in accordance with some embodiments of the present disclosure.
Figure 9A:
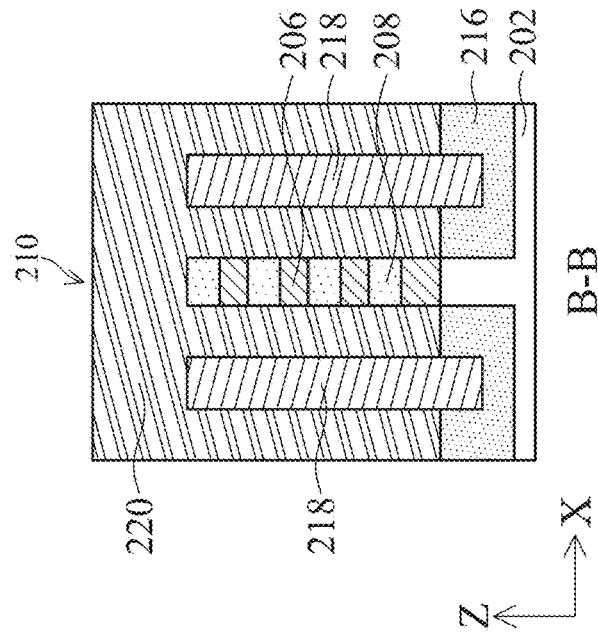
Figure 9B:
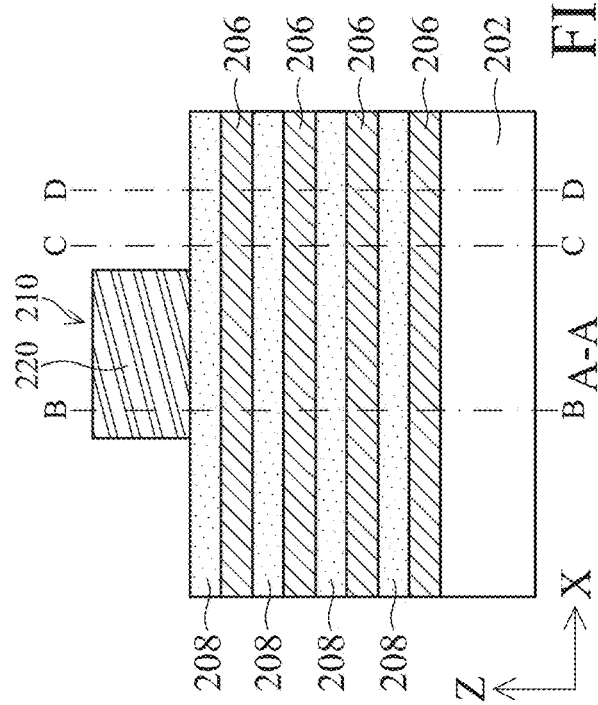
Figure 9C:
Figure 9D:
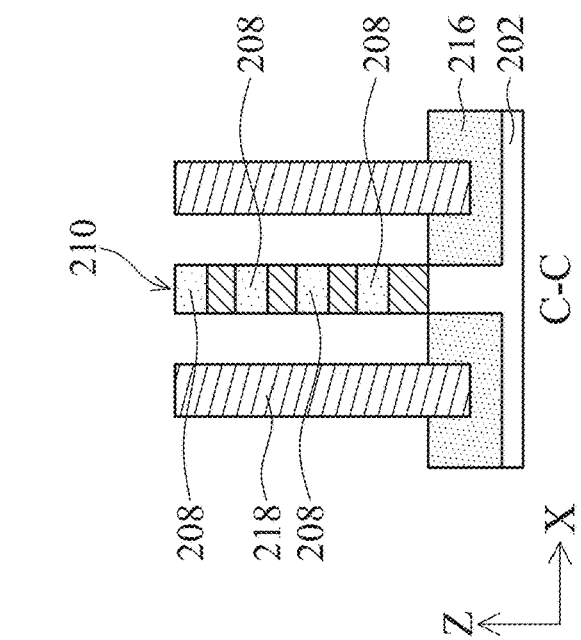
Figure 13B:
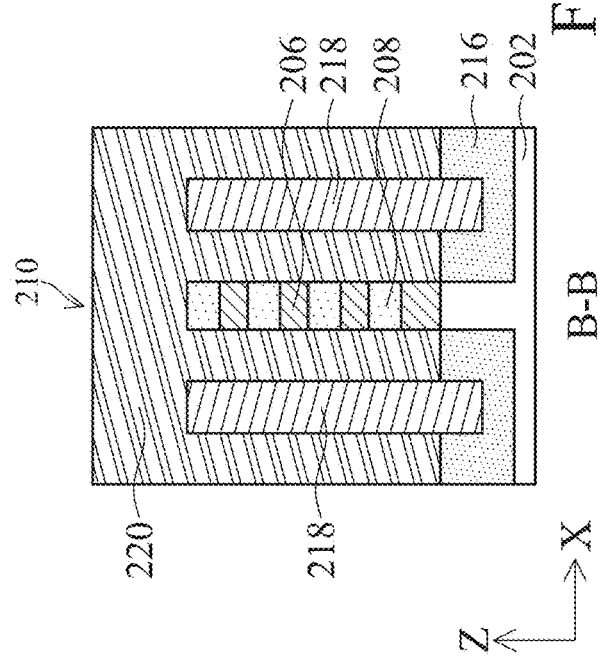
Figure 13D:
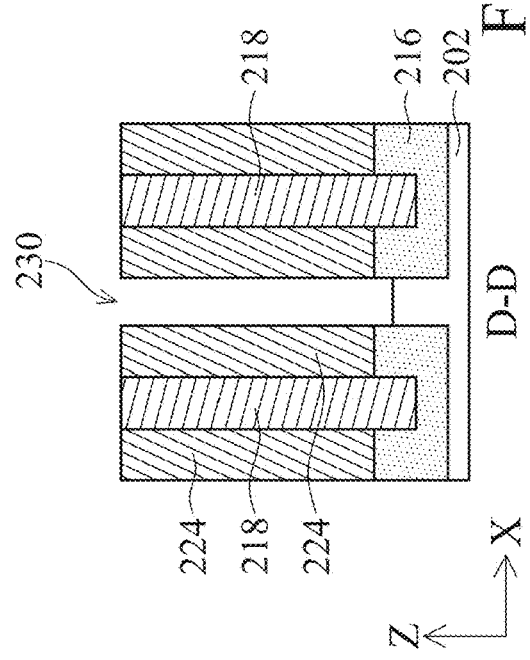
Figure 13A:
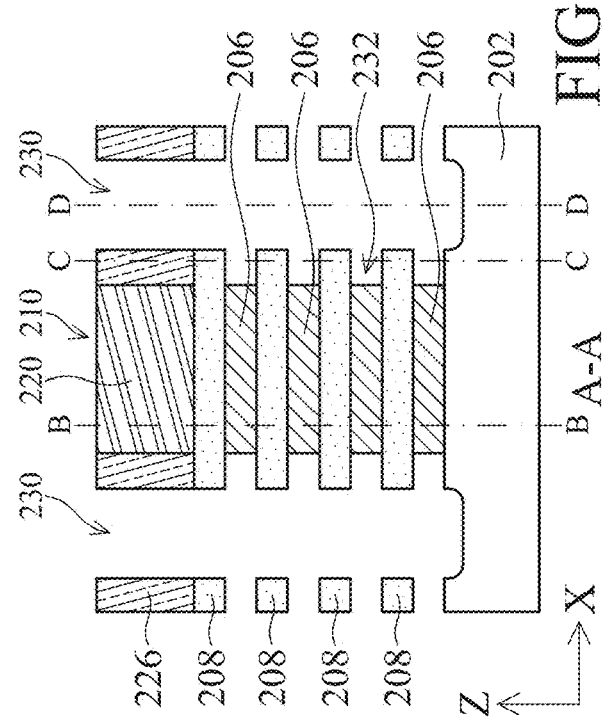
Figure 13C:
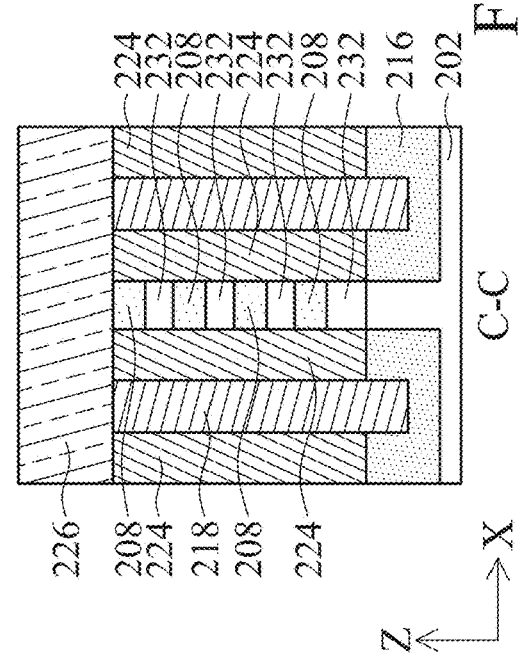
Figure 14A:
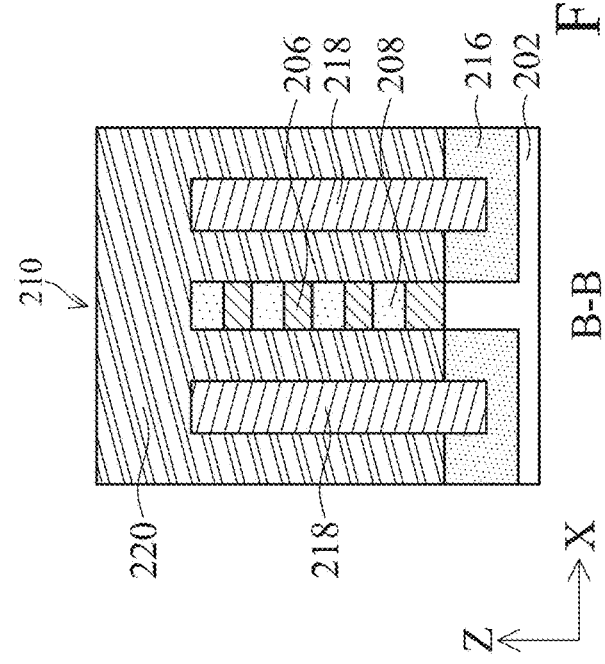
Figure 14C:
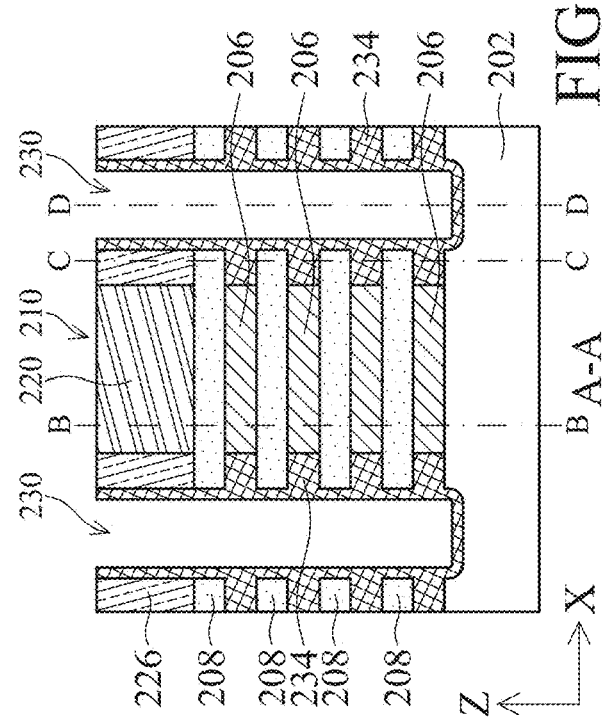
Figure 14B:
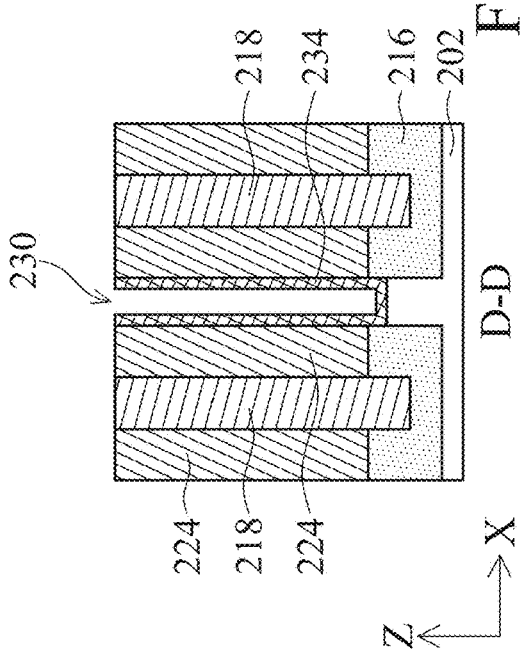
Figure 14D:
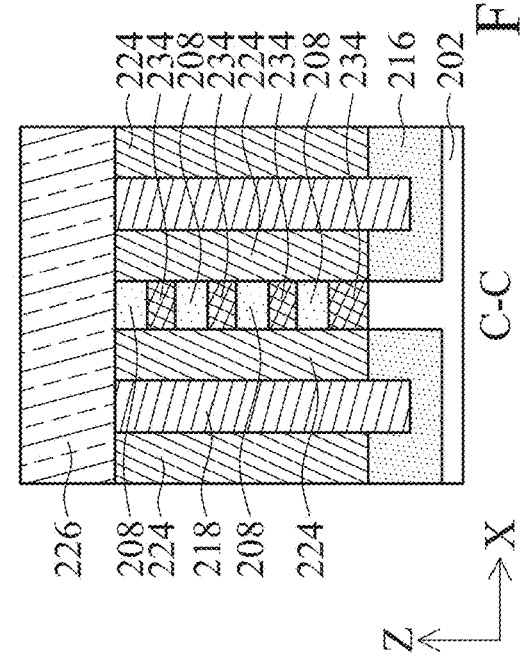
Figure 15A:
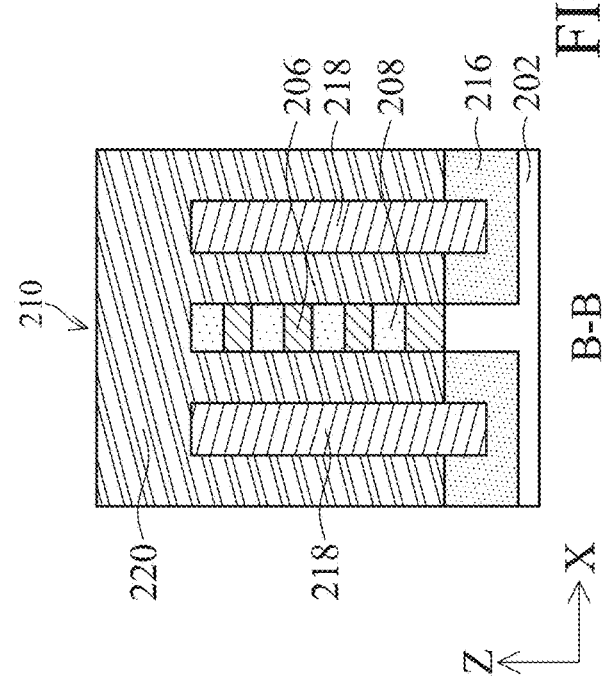
Figure 15B:
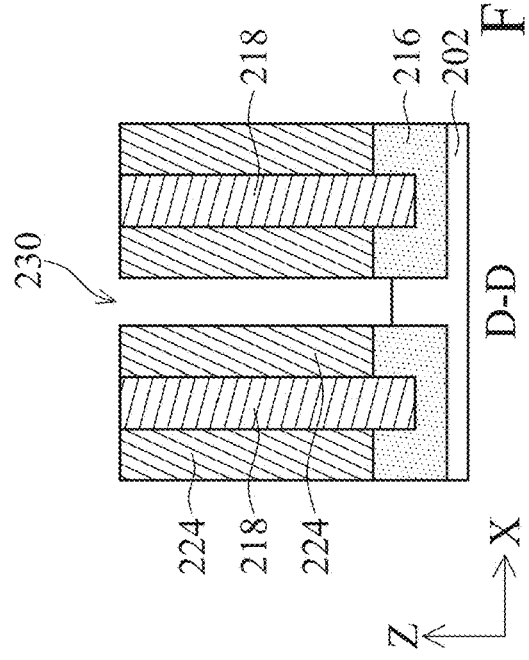
Figure 15C:
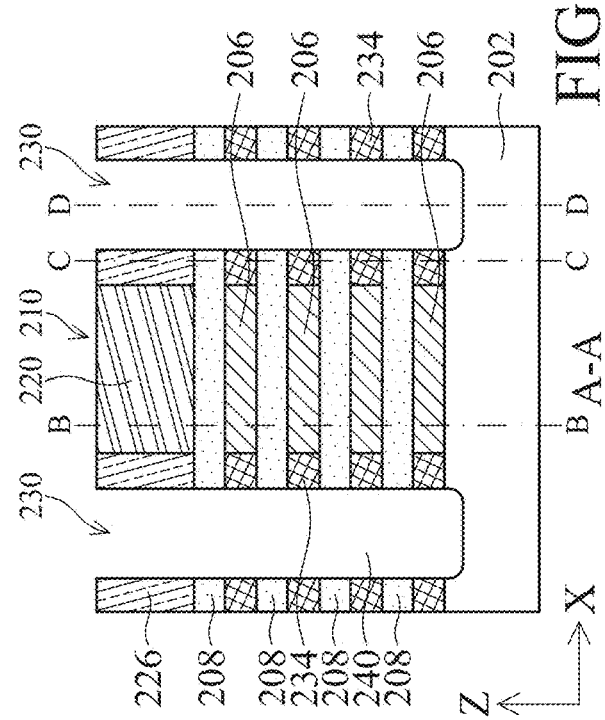
Figure 15D:
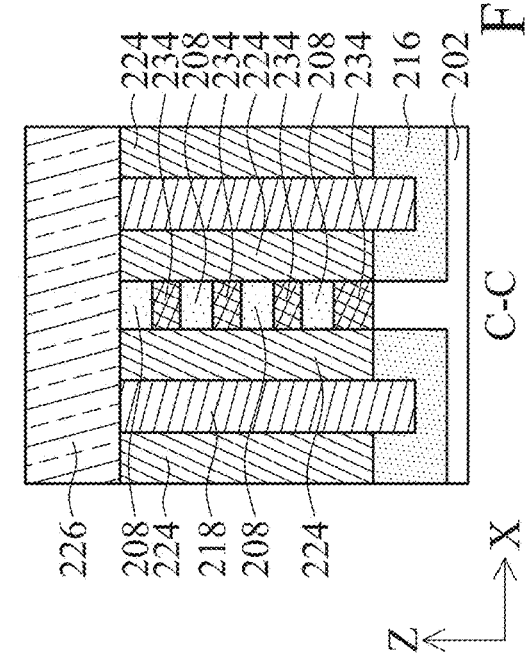
Figure 16A:
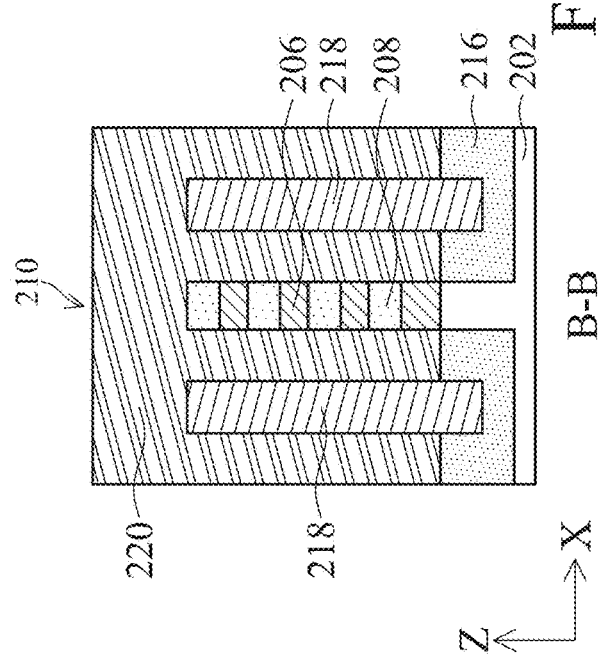
Figure 16C:
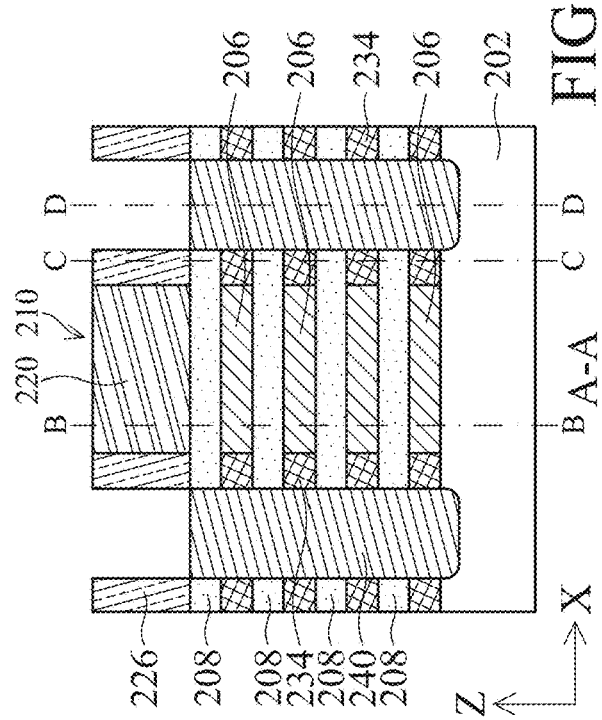
Figure 16B:
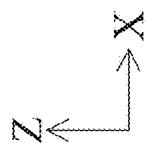
Figure 16D:
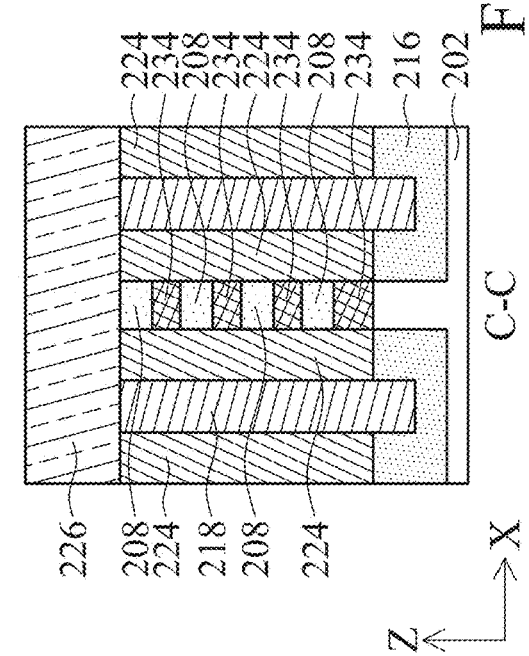

FIGS. 1A-C will be described below in conjunction with FIGS. 2-27D. FIGS. 2, 3, 4, 5, 6, 7 are fragmentary cross-sectional views of a semiconductor device 200 (or device 200) at various stages of fabrication according to method 100. FIG. 8 is a diagrammatic perspective view of a semiconductor device 200 at a certain stage of fabrication according to method 100. FIGS. 9A, 10A, 11A, 12A, 13A, 14A, 15A, 16A, 17A, 18A, 19A, 20A, 21A, 22A, 23A, 24A, 25A, 26A, and 27A are corresponding fragmentary cross-sectional views of a semiconductor device 200 along a first cut A-A; FIGS. 9B, 10B, 11B, 12B, 13B, 14B, 15B, 16B, 17B, 18B, 19B, 20B, 21B, 22B, 23B, 24B, 25B, 26B, and 27B are corresponding fragmentary cross-sectional views of a semiconductor device 200 along a second cut B-B being in a channel region; FIGS. 9C, 10C, 11C, 12C, 13C, 14C, 15C, 16C, 17C, 18C, 19C, 20C, 21C, 22C, 23C, 24C, 25C, 26C, and 27C are corresponding fragmentary cross-sectional views of a semiconductor device 200 along a third cut C-C being through gate sidewall spacer features; and FIGS. 9D, 10D, 11D, 12D, 13D, 14D, 15D, 16D, 17D, 18D, 19D, 20D, 21D, 22D, 23D, 24D, 25D, 26D, and 27D are corresponding fragmentary cross-sectional views of a semiconductor device 200 along a fourth cut D-D being in an S/D region. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 2-27D and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-27D, as with the remainder of the method and exemplary figures provided in this disclosure, are merely exemplary and are not intended to be limiting beyond what is specifically recited in the claims that follow.

Figure 2:
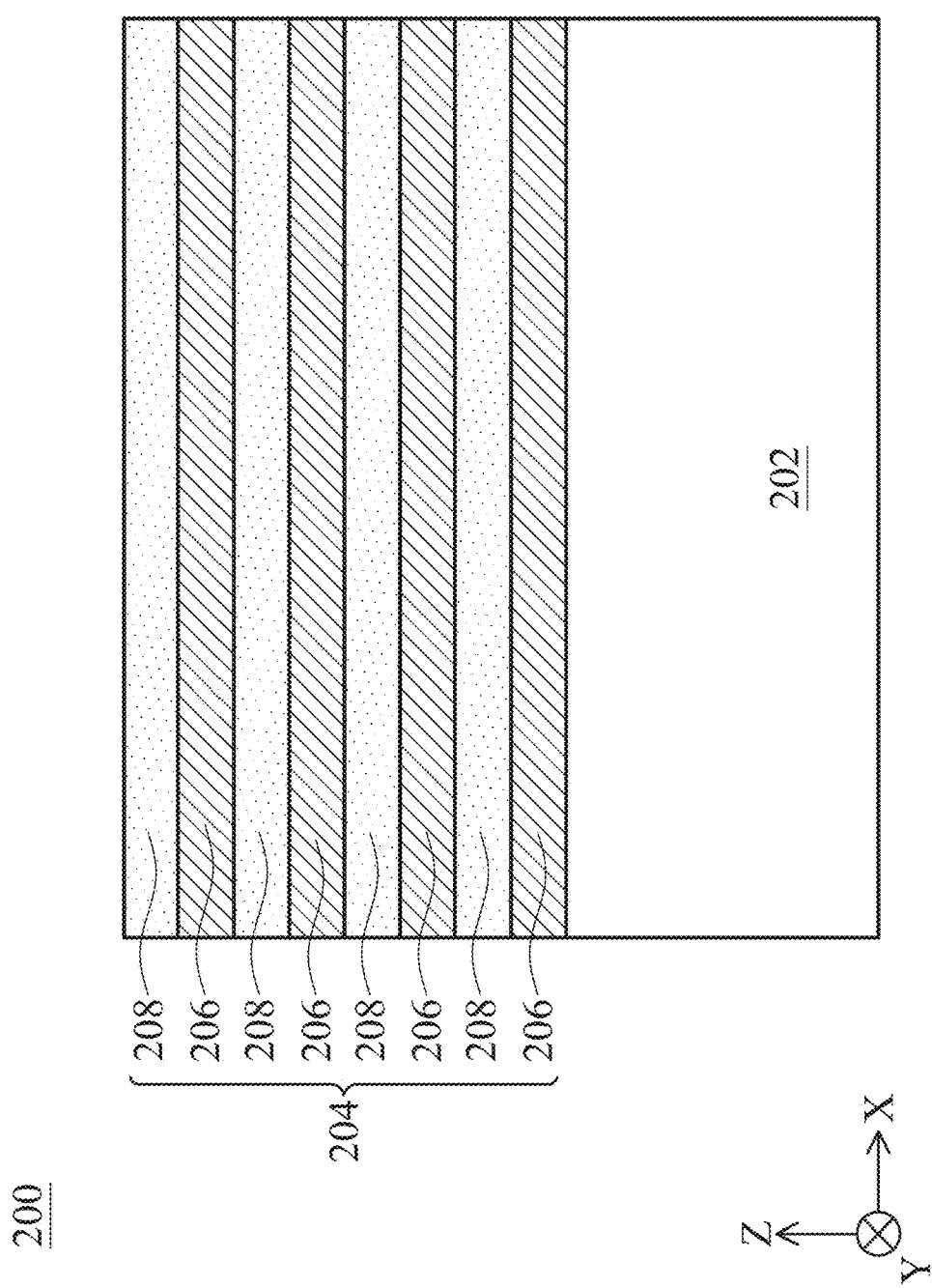
FIGS. 2, 3, 4, 5, 6, 7 are fragmentary cross-sectional views of an example semiconductor device in accordance with some embodiments of the present disclosure.

At operation 102, the method 100 (FIG. 1A) provides a substrate 202, as shown in FIG. 2. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features. In an embodiment of the method 100, at operation 102, an anti-punch through (APT) implant is performed. The APT implant may be performed in a region underlying the channel region of a device for example, to prevent punch-through or unwanted diffusion.

Still referring to FIG. 2, at operation 104, the method 100 (FIG. 1A) forms one or more epitaxial layers over the substrate 202. In some embodiments, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. In some embodiments, the epitaxial layer 206 includes SiGe and where the epitaxial layer 208 includes Si, the Si oxidation rate of the epitaxial layer 208 is less than the SiGe oxidation rate of the epitaxial layer 206. It is noted that four (4) layers of each of epitaxial layers 206 and 208 are illustrated in FIG. 2, which is for illustrative purposes only and not intended to be limiting beyond what is specifically recited in the claims. It can be appreciated that any number of epitaxial layers can be formed in the epitaxial stack 204; the number of layers depending on the desired number of channels regions for the semiconductor device 200. In some embodiments, the number of epitaxial layers 208 is between 2 and 10.

In some embodiments, the epitaxial layer 206 has a thickness range of about 2-6 nanometers (nm). The epitaxial layers 206 may be substantially uniform in thickness. In some embodiments, the epitaxial layer 208 has a thickness range of about 6-12 nm. In some embodiments, the epitaxial layers 208 of the stack are substantially uniform in thickness. As described in more detail below, the epitaxial layer 208 may serve as channel region(s) for a subsequently-formed multi-gate device and its thickness chosen based on device performance considerations. The epitaxial layer 206 may serve to define a gap distance between adjacent channel region(s) for a subsequently-formed multi-gate device and its thickness chosen based on device performance considerations.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206 and 208 include a different material than the substrate 202. As stated above, in at least some examples, the epitaxial layer 206 includes an epitaxially grown SiGe layer and the epitaxial layer 208 includes an epitaxially grown Si layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etch selectivity properties. In various embodiments, the epitaxial layers 206 and 208 are substantially dopant-free (i.e., having an extrinsic dopant concentration from about 0 cm$^{-3}$ to about $1\times10^{17}$ cm$^{-3}$), where for example, no intentional doping is performed during the epitaxial growth process.

At operation 106, the method 100 (FIG. 1A) patterns the epitaxial stack 204 to form device fins 210 (also referred to as semiconductor fins). With reference to the example of FIG. 3, in an embodiment of operation 106, a plurality of device fins 210 extending from the substrate 202 are formed. In various embodiments, each of the device fins 210 includes a substrate portion formed from the substrate 202, portions of each of the epitaxial layers of the epitaxial stack including epitaxial layers 206 and 208. In some embodiments, operation 106 includes forming a mask layer 212 over the epitaxial stack 204. The mask layer 212 includes a first mask layer 212A and a second mask layer 212B. The first mask layer 212A is a pad oxide layer made of a silicon oxide, which can be formed by a thermal oxidation. The second mask layer 212B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 212 is patterned into a mask pattern by using patterning operations including photo-lithography and etching.

Figure 3:
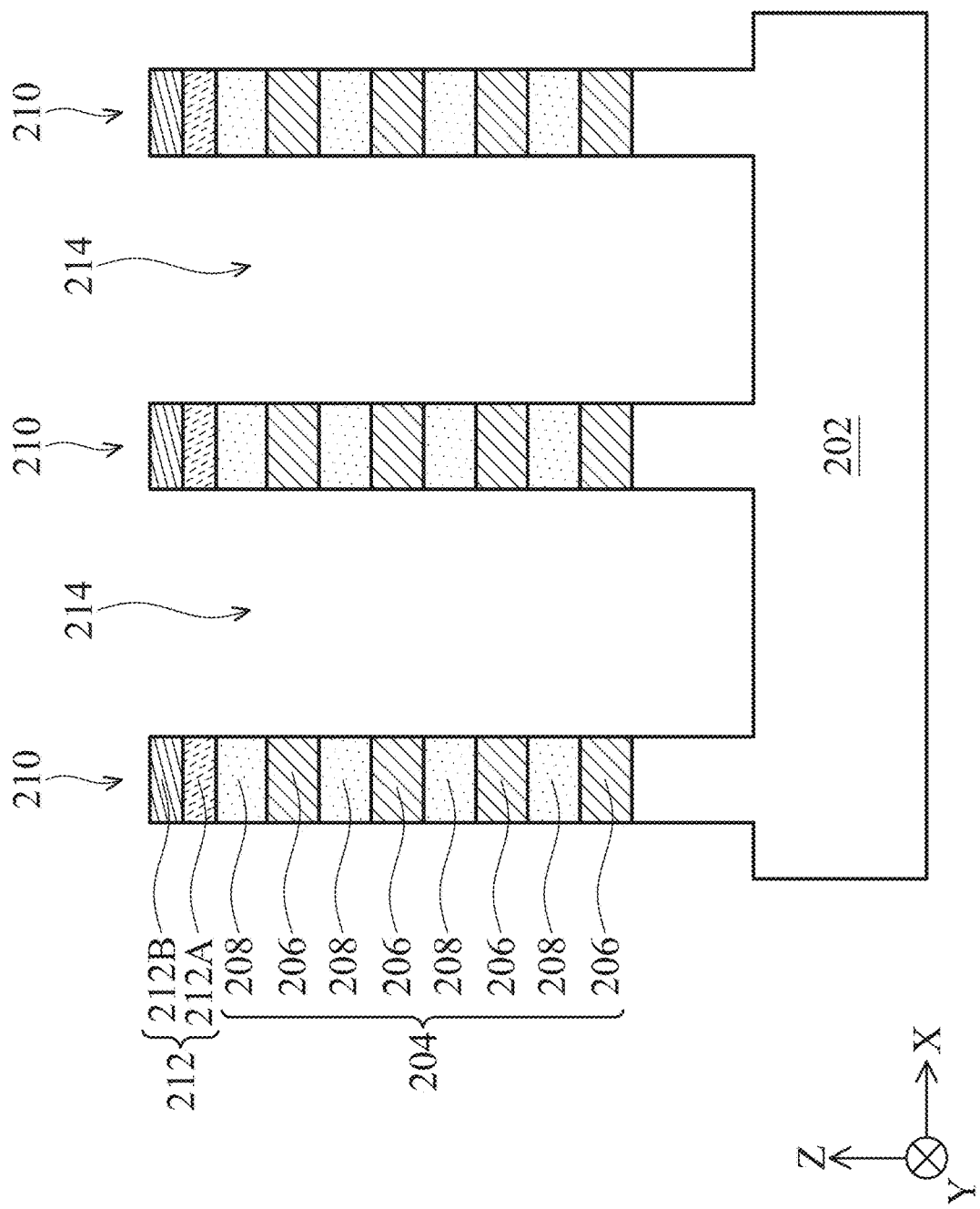

Operation 106 subsequently patterns the epitaxial stack 204 in an etching process, such as a dry etch (e.g., reactive ion etching), a wet etch, and/or other suitable process, through openings defined in the patterned mask layer 212. The stacked epitaxial layers 206 and 208 are thereby patterned into device fins 210 with trenches 214 between adjacent device fins 210. Each of the device fins 210 protrudes upwardly in the z-direction from the substrate 202 and extends lengthwise in the y-direction. In various other embodiments, the device fins 210 may be patterned by any suitable method. For example, the device fins 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the device fins 210. In FIG. 3, three (3) device fins 210 are spaced apart along in the x-direction. But the number of the device fins 210 is not limited to three, and may be as small as one or more than three.

Figure 4:
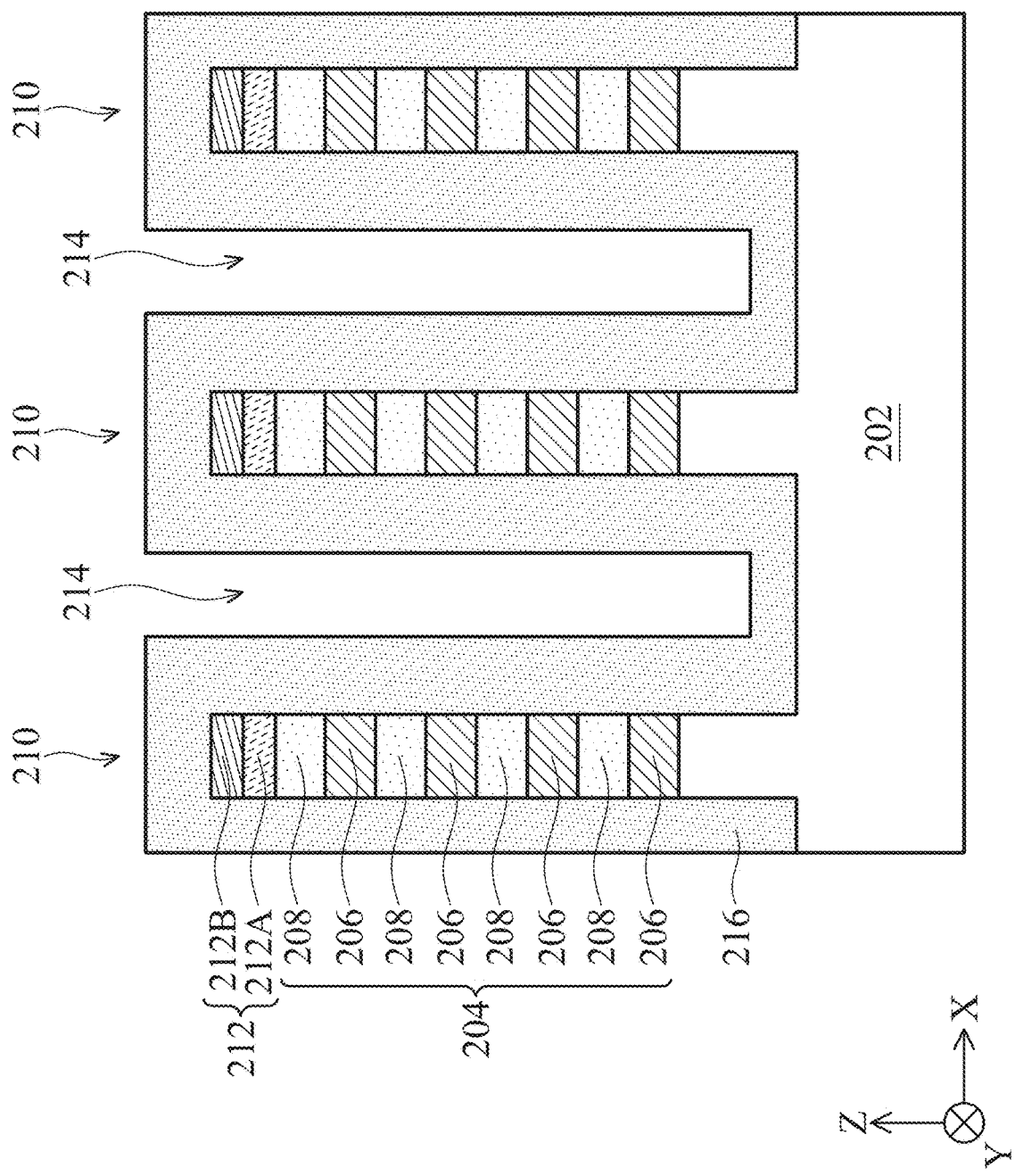

At operation 108, the method 100 (FIG. 1A) partially fills the trenches 214 with a dielectric material to form an isolation feature 216, as shown in FIG. 4. The isolation feature 216 may include one or more dielectric layers. Suitable dielectric materials for the isolation feature 216 may include silicon oxides, silicon nitrides, silicon carbides, FluoroSilicate Glass (FSG), low-K dielectric materials, and/or other suitable dielectric materials. The dielectric material may be deposited by any suitable technique including thermal growth, CVD, HDP-CVD, PVD, ALD, and/or spin-on techniques. In one embodiment, the isolation feature 216 is deposited as a conformal layer, covering each of the device fins 210. Conformal deposition techniques may be used, such as an ALD process. The width of the trenches 214 becomes narrower after the deposition of the isolation feature 216. As will be shown below, dielectric fins will be formed in these trenches.

Figure 5:
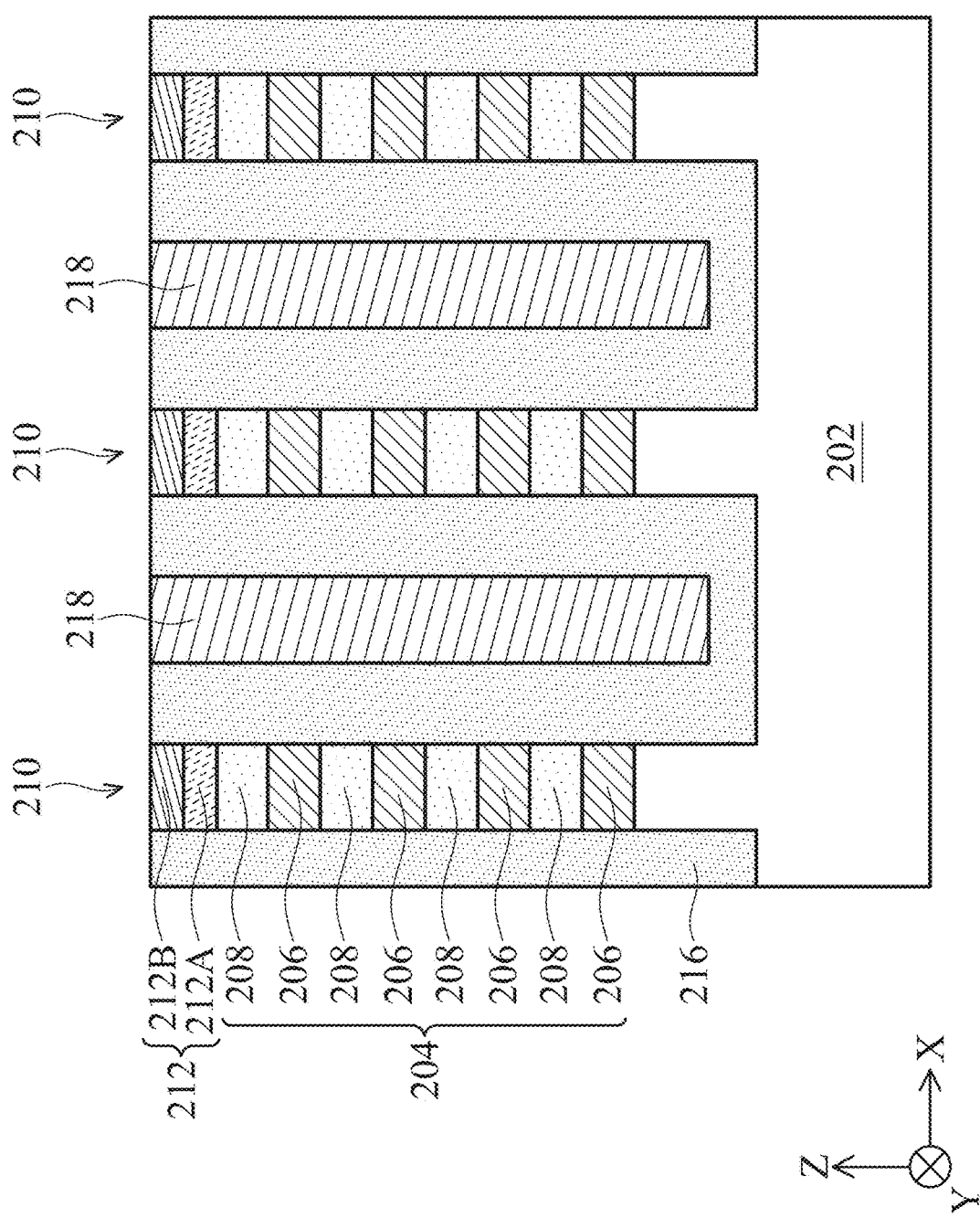

At operation 110, the method 100 (FIG. 1A) deposits dielectric fins 218 (also referred to as dummy fins or hybrid fins) in the trenches 214, as shown in FIG. 5. Unlike the device fins 210 configured to provide active regions, the dielectric fins 218 are inactive and not configured to form active regions. In some embodiments, the dielectric fins 218 are provided to adjust fin-to-fin spacing (i.e., fin pitch) to improve the uniformity of fin density, which in turn improves and provides better structure fidelity. The dielectric fins 218 could also help to release fin patterning loading effect and prevent source/drain EPI bridge. The dielectric fins 218 may include any suitable dielectric material including silicon carbide nitride, silicon carbide oxynitride, and metal oxide, such as hafnium oxide, zirconium oxide, and aluminum oxide, and/or other suitable dielectric materials, and may be deposited by any suitable deposition process including thermal growth, CVD, HDP-CVD, PVD, ALD, and/or other suitable processes. In a particular example, the dielectric fins 218 include aluminum oxide ($Al_2O_3$) deposited by CVD. Following the deposition, a CMP process may be performed to remove excess dielectric material. In some embodiments, the mask layer 212 may function as a CMP stop layer.

Figure 6:
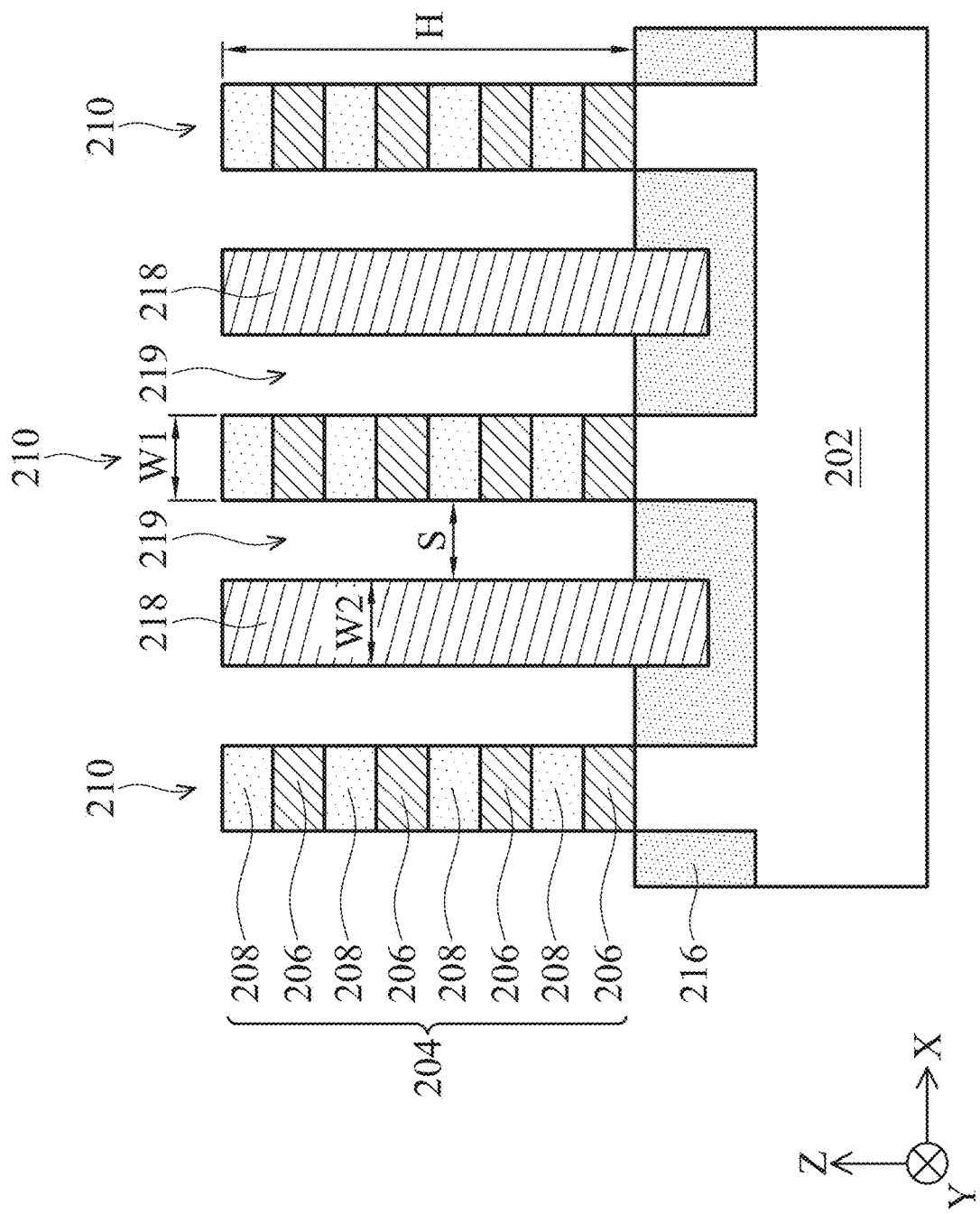

At operation 112, the method 100 (FIG. 1A) recesses the isolation features 216 to form shallow trench isolation (STI) features, as shown in FIG. 6. Any suitable etching technique may be used to recess the isolation features 216 including dry etching, wet etching, RIE, and/or other etching methods, and in an exemplary embodiment, an anisotropic dry etching is used to selectively remove the dielectric material of the isolation features 216 without etching the device fins 210 and the dielectric fins 218. The mask layer 212 may also be removed before, during, and/or after the recessing of the isolation features 216. In some embodiments, the mask layer 212 is removed by a CMP process performed prior to the recessing of the isolation features 216. In some embodiments, the mask layer 212 is removed by an etchant used to recess the isolation features 216.

In the illustrated embodiment in FIG. 6, after operation 112 the dielectric fins 218 extend upwardly from the recessed isolation features 216. Referring to FIG. 7, in another illustrated embodiment, the dielectric fins 218 extend upwardly from the substrate 202. In this embodiment, the isolation features 216 may first be deposited as a spacer layer over sidewalls of the device fins 210 with substrate 202 exposed in the trenches 214. Subsequently, the dielectric fins 218 are deposited over sidewalls of the isolation features 216. Accordingly, the dielectric fins 218 are in contact with the substrate 202 in this embodiment. Thereafter, the isolation features 216 are recessed such that its top surface is lower than both a top surface of the device fins 210 and a top surface of the dielectric fins 218.

Referring to FIGS. 6 and 7 collectively, the heights H of the device fins 210 and dielectric fins 218 above the isolation features 216 are substantially the same, such as about 40 nm to about 60 nm in some embodiments. Adjacent device fin 210 and dielectric fin 218 define a trench 219 in between. The trench 219 has a width S ranges from about 5 nm to about 20 nm in some embodiments. A ratio of the width W1 (measured in x-direction) of the device fin 210 over the width W2 (measured in x-direction) of the dielectric fin 218 is about 4:1 to about 7:1. If the ratio is larger than 7:1, the dielectric fin 218 may be too thin for enough mechanical strength. If the ratio is smaller than 4:1, the dielectric fin 218 may be too wide which increases fin pitch and enlarges circuit area. In a particular example, W1 ranges from about 20 nm to about 70 nm, W2 ranges from about 5 nm to about 10 nm.

At operation 114, the method 100 (FIG. 1A) forms a sacrificial (dummy) gate structure 220, as shown in FIG. 8. For the sake of simplicity and clarity, only one device fin 210 and two adjacent dielectric fins 218, and one sacrificial gate structure are depicted in FIG. 8. But the number of the device fins, dielectric fins, and sacrificial gate structures is not limited. The sacrificial gate structure 220 is formed over a portion of the device fin 210 which is to be a channel region. The sacrificial gate structure 220 defines the channel region of the GAA device. The sacrificial gate structure 220 includes a sacrificial gate dielectric layer (not shown) and a sacrificial gate electrode layer. The sacrificial gate structure 220 is formed by first blanket depositing the sacrificial gate dielectric layer over the device fin 210 and the dielectric fins 218 (collectively, as fins). A sacrificial gate electrode layer is then blanket deposited on the sacrificial gate dielectric layer and over the fins, such that the fins are fully embedded in the sacrificial gate electrode layer. The sacrificial gate electrode layer includes silicon such as polycrystalline silicon or amorphous silicon. The thickness of the sacrificial gate dielectric layer is in a range from about 1 nm to about 5 nm in some embodiments. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer may be deposited using CVD, including LPCVD and PECVD, PVD, ALD, or other suitable process. Subsequently, a mask layer 222 is formed over the sacrificial gate electrode layer. The mask layer 222 may include a pad silicon oxide layer 222A and a silicon nitride mask layer 222B. Subsequently, a patterning operation is performed on the mask layer 222 and sacrificial gate dielectric and electrode layers are patterned into the sacrificial gate structure 220, as shown in FIG. 8. By patterning the sacrificial gate structure 220, the epitaxial stack 204 of the first and second semiconductor layers are partially exposed on opposite sides of the sacrificial gate structure 220, thereby defining source/drain (S/D) regions. In this disclosure, a source and a drain are interchangeably used and the structures thereof are substantially the same. By the operations explained with FIG. 8, the structure of FIGS. 9A-D can be obtained. In FIGS. 9A-D, the upper portion of the sacrificial gate structure 220 is not shown.

At operation 116, the method 100 (FIG. 1A) deposits sacrificial spacers 224 in trenches 219 which are defined between adjacent device fin 210 and dielectric fins 218 in the S/D region, as shown in FIG. 10A-D. Suitable dielectric materials for the sacrificial spacers 224 may include silicon oxides, silicon nitrides, silicon carbides, silicon carbide nitride, silicon oxide carbide, silicon carbide oxynitride, and/or other suitable dielectric materials. The sacrificial spacers 224 are made of different materials from the dielectric fins 218 and the isolation feature 216 so that the sacrificial spacers 224 can be selectively etched. In some embodiments, forming of the sacrificial spacers 224 includes depositing suitable dielectric materials in the trenches 219 and over top surfaces of the device fin 210 and the dielectric fins 218, and followed by an isotropic etching to remove excess dielectric materials from top surfaces of the device fin 210 and the dielectric fins 218, such that the sacrificial spacers 224 are formed with top surfaces substantially coplanar with the top surfaces of the device fin 210 and the dielectric fins 218, as shown in FIGS. 10C-D.

At operation 118, the method 100 (FIG. 1A) forms gate sidewall spacers 226 on sidewalls of the sacrificial gate structure 220, as shown in FIGS. 11A-D. The gate sidewall spacers 226 also cover a portion of the top surfaces of the device fin 210, the dielectric fins 218, and the sacrificial spacers 224. The gate sidewall spacers 226 may include a dielectric material such as silicon oxide, silicon nitride, silicon carbide, silicon oxynitride, SiCN films, silicon oxycarbide, SiOCN films, and/or combinations thereof. In some embodiments, the gate sidewall spacers 226 include multiple layers, such as main spacer walls, liner layers, and the like. By way of example, the gate sidewall spacers 226 may be formed by depositing a dielectric material layer over the sacrificial gate structure 220 using processes such as, CVD process, a sub-atmospheric CVD (SACVD) process, a flowable CVD process, an ALD process, a PVD process, or other suitable process. In some embodiments, the deposition of the dielectric material layer is followed by an etching-back (e.g., anisotropically) process to expose portions of the device fin 210 adjacent to and not covered by the sacrificial gate structure 220 (e.g., S/D regions). The dielectric material layer may remain on the sidewalls of the sacrificial gate structure 220 as gate sidewall spacers 226. In some embodiments, the etching-back process may include a wet etch process, a dry etch process, a multiple-step etch process, and/or a combination thereof. The gate sidewall spacers 226 may have a thickness ranging from about 5 nm to about 20 nm.

At operation 120, the method 100 (FIG. 1B) recesses a portion of the device fin 210 to form recesses 230 in the S/D regions, as shown in FIGS. 12A-D. The stacked epitaxial layers 206 and 208 are etched down at the S/D regions. In some embodiments, the substrate 202 is also partially etched (FIG. 12A). In many embodiments, operation 120 forms the recesses 230 by a suitable etching process, such as a dry etching process, a wet etching process, or an RIE process. In some embodiments, operation 120 selectively removes the device fin 210 without etching or substantially etching portions of the sacrificial spacers 224 formed on sidewalls of the device fin 210. The etching process at operation 120 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The extent of which the device fin 210 is removed may be controlled by adjusting the duration of the etching process. In some embodiments, the etching process at operation 120 removes upper portions of the device fin 210 such that a bottom surface of the recesses 230 is below a top surface of the isolation features 216 and above a bottom surface of the dielectric fins 218 (FIG. 12D).

At operation 122, the method 100 (FIG. 1B) forms inner spacers directly under the gate sidewall spacers 226. In some embodiments, operation 122 first laterally etches the epitaxial layers 206 in the y-direction, thereby forming cavities 232, as shown in FIGS. 13A-D. The amount of etching of the epitaxial layers 206 is in a range from about 5 nm to about 20 nm along the y-direction in some embodiments. The epitaxial layers 206 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. Alternatively, operation 122 may first selectively oxidize lateral ends of the epitaxial layers 206 that are exposed in the recesses 230 to increase the etch selectivity between the epitaxial layers 206 and 208. In some examples, the oxidation process may be performed by exposing the semiconductor device 200 to a wet oxidation process, a dry oxidation process, or a combination thereof.

Subsequently, operation 122 conformally forms an inner spacer material layer 234 on the lateral ends of the epitaxial layer 206 and on the epitaxial layers 208 in the recesses 230 and cavities 232. The inner spacer material layer 234 may include silicon oxides, silicon nitrides, silicon carbides, silicon carbide nitride, silicon oxide carbide, silicon carbide oxynitride, and/or other suitable dielectric materials. In the illustrated embodiment, the inner spacer material layer 234 and the sacrificial spacers 224 are formed of the same material composition, such that the inner spacer material layer 234 and the sacrificial spacers 224 can be removed together in an etch process later on. The inner spacer material layer 234 can be formed by ALD or any other suitable method. By conformally forming the inner spacer material layer 234, the size of cavity 232 is reduced or completely filled.

After the inner spacer material layer 234 is formed, an etching operation is performed to partially remove the inner spacer material layer 234, as shown in FIGS. 15A-D. By this etching, the inner spacer material layer 234 remains substantially within the cavity 232, because of a small volume of the cavity. Generally, plasma dray etching etches a layer in wide and flat areas faster than a layer in concave (e.g., holes, grooves and/or slits) portions. Thus, the inner spacer material layer 234 can remain inside the cavities 232. The remained portions of the inner spacer material layer 234 is denoted as the inner spacers 234.

At operation 124, the method 100 (FIG. 1B) forms epitaxial S/D features 240 in recesses 230, as shown in FIGS. 16A-D. In some embodiments, the epitaxial S/D features 240 include one or more layers of Si, SiP, SiC, and SiCP for an n-type FET or Si, SiGe, Ge for a p-type FET. For the p-channel FET, boron (B) may also be contained in the source/drain. The epitaxial S/D features 240 are formed by an epitaxial growth method using CVD, ALD or molecular beam epitaxy (MBE). The epitaxial S/D features 240 are formed in contact with the epitaxial layers 208, and separated from the epitaxial layers 206 by the inner spacers 234. Since recesses 230 in the x-direction are defined by sidewalls of the sacrificial spacer 224, the width W3 of the epitaxial S/D in the x-direction is confined by sidewalls of the sacrificial spacer 224 (FIG. 16D), which is substantially equal to the width W1 (FIG. 6) of the device fin 210. By laterally restricting the dimensions of the epitaxial S/D features 240, the stray capacitance between the epitaxial S/D features 240 and the to-be-formed metal gate structure is reduced.

At operation 126, the method 100 (FIG. 1B) forms an interlayer dielectric (ILD) layer 250 over the epitaxial S/D features 240, as shown in FIGS. 17A-D. In some embodiments. The ILD layer 250 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 250 may include a multi-layer structure having multiple dielectric materials and may be formed by a deposition process such as, for example, CVD, flowable CVD (FCVD), spin-on-glass (SOG), other suitable methods, or combinations thereof. In some embodiments, forming the ILD layer 250 further includes performing a CMP process to planarize a top surface of the semiconductor device 200, such that the top surfaces of the sacrificial gate structure 220 are exposed.

At operation 128, the method 100 (FIG. 1B) removes the sacrificial gate structure 220 to form a gate trench 254, as shown in FIGS. 18A-D. The gate trench 254 exposes the device fin 210 and the dielectric fins 218 in the channel region. The ILD layer 250 protects the epitaxial S/D features 240 during the removal of the sacrificial gate structure 220. The sacrificial gate structure 220 can be removed using plasma dry etching and/or wet etching. When the sacrificial gate electrode layer is polysilicon and the ILD layer 250 is silicon oxide, a wet etchant such as a TMAH solution can be used to selectively remove the sacrificial gate electrode layer. The sacrificial gate dielectric layer is thereafter removed using plasma dry etching and/or wet etching.

Figure 19A:
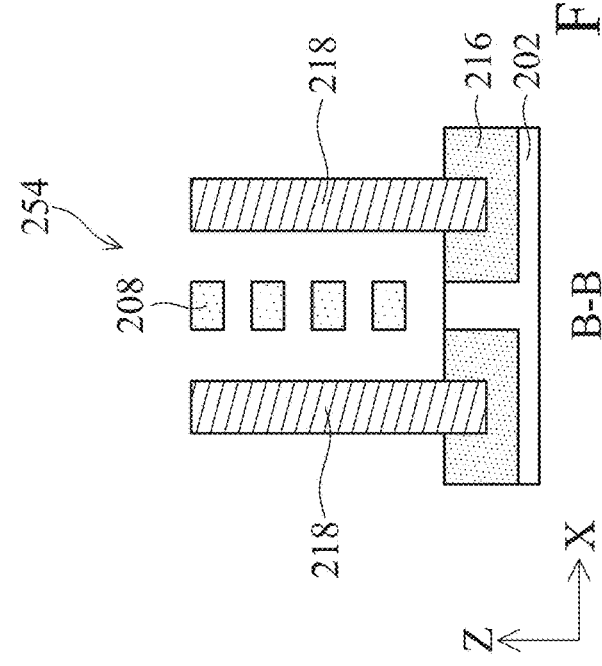
Figure 19C:
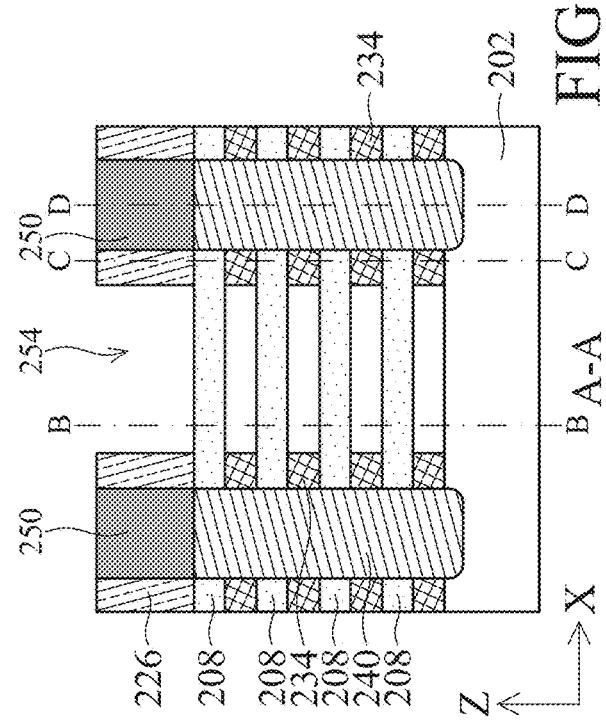
Figure 19B:
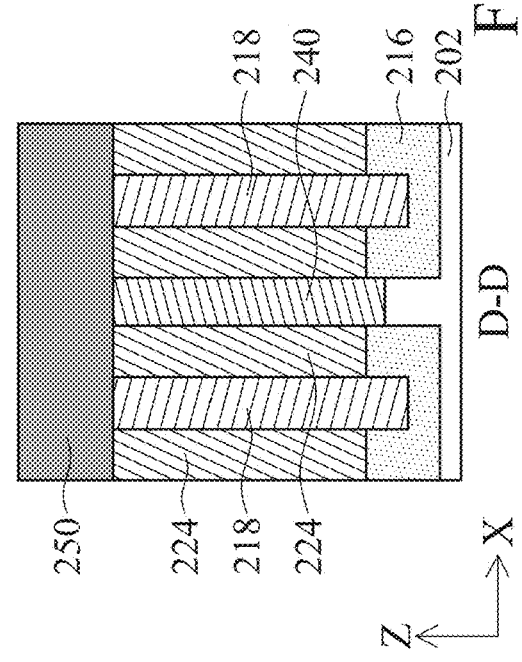
Figure 19D:
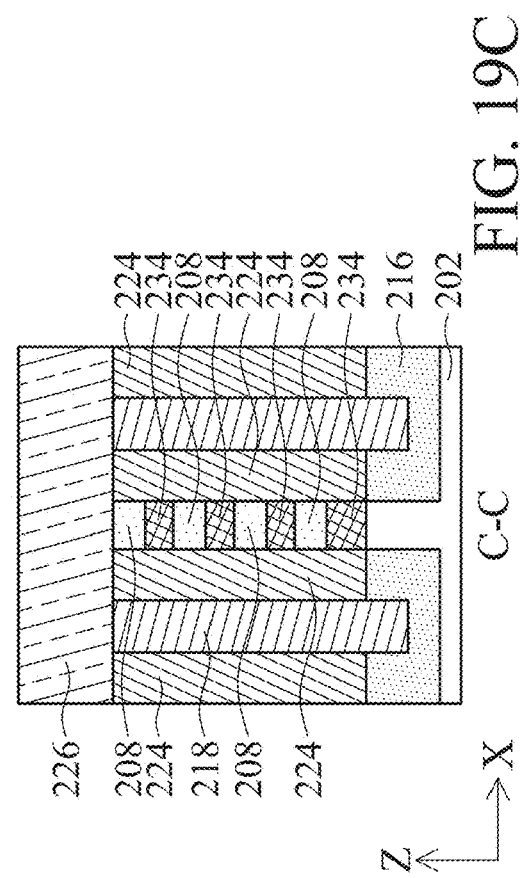
Figure 20A:
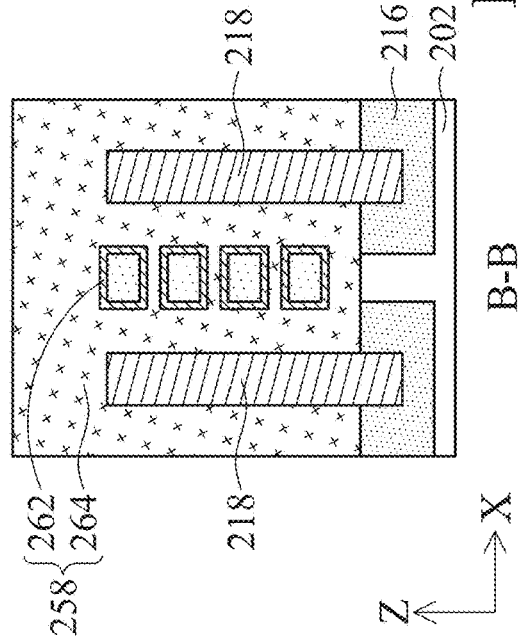
Figure 20B:
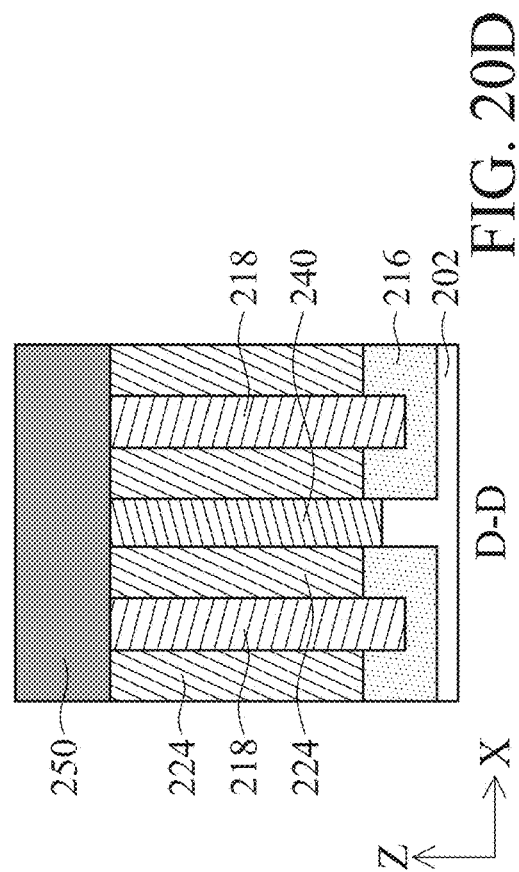
Figure 20C:
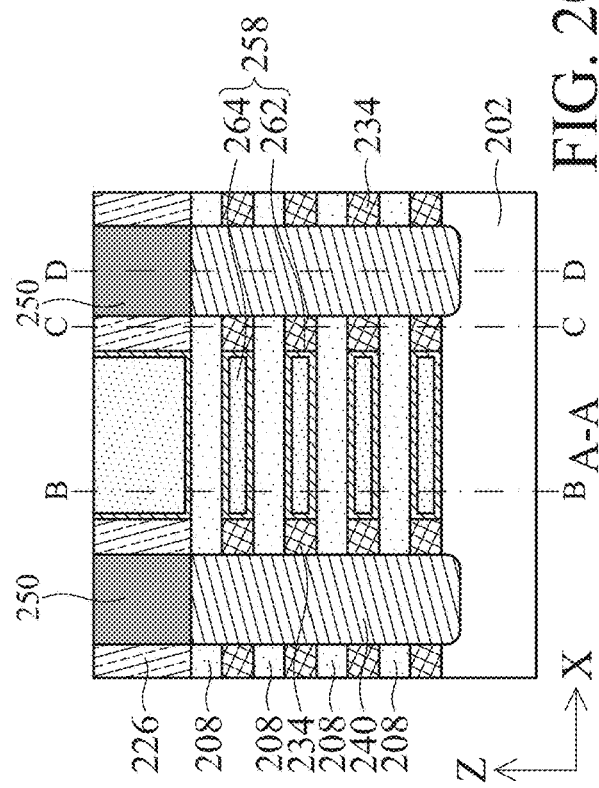
Figure 20D:
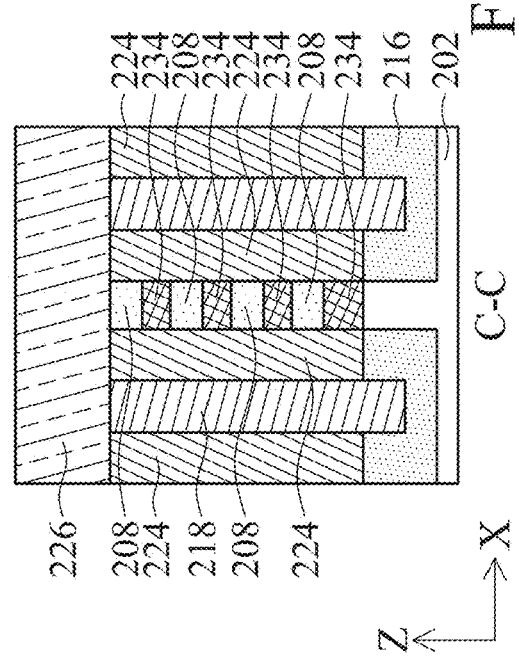

At operation 130, the method 100 (FIG. 1B) releases channel members from the channel region of the GAA device, as shown in FIGS. 19A-D. In the illustrated embodiment, channel members are epitaxial layers 208 in the form of semiconductor wires after operation 130. In the present embodiment, the epitaxial layers 208 include silicon, and the epitaxial layers 206 include silicon germanium. The plurality of epitaxial layers 206 may be selectively removed. In some implementations, the selectively removal process includes oxidizing the plurality of epitaxial layers 206 using a suitable oxidizer, such as ozone. Thereafter, the oxidized epitaxial layers 206 may be selectively removed from the gate trench 254. To further this embodiment, the operation 130 includes a dry etching process to selectively remove the epitaxial layers 206, for example, by applying an HCl gas at a temperature of about 500° C. to about 700° C., or applying a gas mixture of $CF_4$, $SF_6$, and $CHF_3$. For the sake of simplicity and clarity, after operation 130, the epitaxial layers 208 are denoted as semiconductor wires 208. At this point, as shown in FIG. 19B, vertically stacked semiconductor wires 208 are formed in the channel region of the GAA device.

At operation 132, the method 100 (FIG. 1B) forms metal gate structure 258 in the gate trench 254 engaging the semiconductor wires 208 in the channel region, as shown in FIGS. 20A-D. A gate dielectric layer 262 is formed wrapping each semiconductor wires 208 in the channel region, and a gate electrode layer 264 is formed on the gate dielectric layer 262. The inner spacers 234 separate the metal gate structure 258 from contacting the epitaxial S/D features 240.

In some embodiments, the gate dielectric layer 262 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 262 includes an interfacial layer (not shown) formed between the channel layers and the dielectric material. The gate dielectric layer 262 may be formed by CVD, ALD or any suitable method. In one embodiment, the gate dielectric layer 262 is formed using a highly conformal deposition process such as ALD in order to ensure the formation of a gate dielectric layer having a uniform thickness around each channel layers. The thickness of the gate dielectric layer 262 is in a range from about 1 nm to about 6 nm in some embodiments.

The gate electrode layer 264 is formed on the gate dielectric layer 262 to surround each channel layer. The gate electrode layer 264 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 264 may be formed by CVD, ALD, electro-plating, or other suitable method. The gate dielectric layer 262 and the gate electrode layer 264 may also be deposited over the upper surface of the ILD layer 250. The gate dielectric layer 262 and the gate electrode layer 264 formed over the ILD layer 250 are then planarized by using, for example, CMP, until the top surface of the ILD layer 250 is revealed. In some embodiments, after the planarization operation, the gate electrode layer 264 is recessed and a cap insulating layer (not shown) is formed over the recessed gate electrode 264. The cap insulating layer includes one or more layers of a silicon nitride-based material, such as SiN. The cap insulating layer can be formed by depositing an insulating material followed by a planarization operation. In certain embodiments of the present disclosure, one or more work function adjustment layers (not shown) are interposed between the gate dielectric layer 262 and the gate electrode 264. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 21A:
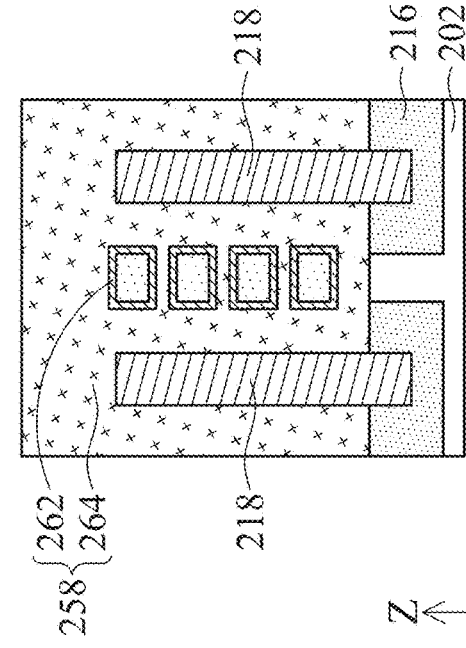
Figure 21B:
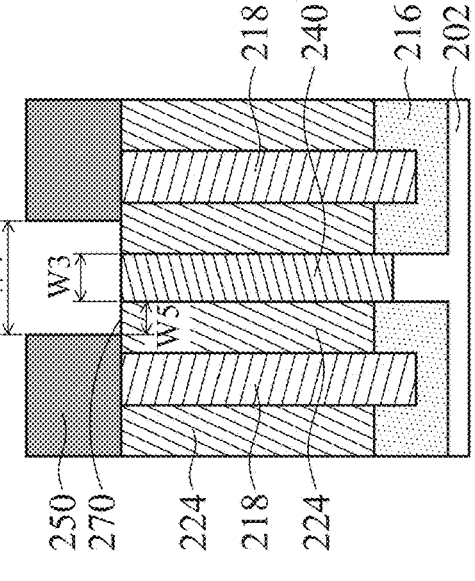
Figure 21C:
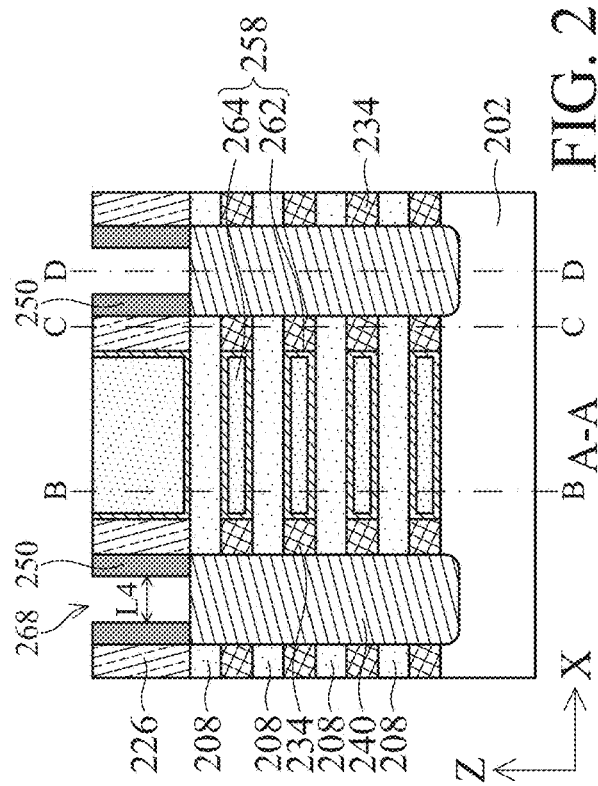
Figure 21D:
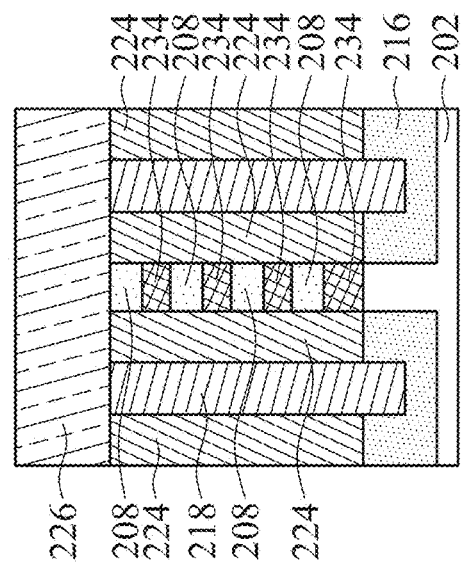

At operation 134, the method 100 (FIG. 1B) forms contact holes 268 in the ILD layer 250 by using dry etching, thereby exposing the upper portion of the epitaxial S/D features 240, as shown in FIGS. 21A-D. The contact holes 268 has a width W4 (in the x-direction) that is larger than the width W3 of the epitaxial S/D features 240 (FIG. 21D). In some embodiments, the width W4 ranges from about 30 nm to about 80 nm. In the illustrated embodiment, a length L4 of the contact holes 268 (in the y-direction) is smaller than a length of the epitaxial S/D features 240 (in the y-direction) (FIG. 21A). The contact holes 268 also expose a portion of the top surface 270 of the sacrificial spacers 224. As to be shown later on, an etch process removes the sacrificial spacers 224 and inner spacers 234 through the exposed top surface 270. The exposed top surface 270 has a width W5 (in the x-direction) on each side of the epitaxial S/D features 240 that is about one eighth (⅛) to about one third (⅓) of the width W3 of the epitaxial S/D features 240. If the width W5 is smaller than one eighth (⅛) of the width W3, the opening will be too small for etchants to effectively enter to remove the sacrificial spacers 224 and inner spacers 234 and also difficult for etching by-products to be removed. If the width W5 is larger than one third (⅓) of the width W3, the opening will be too large for a later-on capping process to seal the to-be-formed air gap. In some embodiments, the width W5 ranges from about 5 nm to about 20 nm.

At operation 136, the method 100 (FIG. 1C) performs one or more selective etching processes to remove the sacrificial spacers 224 and subsequently the inner spacers 234, thereby forming an air gap 280, as shown in FIGS. 22A-D. The etching is performed through the partially exposed top surface 270 (FIG. 21D) of the sacrificial spacers 224. The etching process(es) may implement any suitable etchant configured to remove the sacrificial spacers 224 and the inner spacers 234 without removing or substantially removing the epitaxial S/D features 240, the dielectric fins 218, the isolation features 216, and the ILD layer 250. In some examples, the etching process may be an isotropic etching process (e.g., an isotropic dry etching or an isotropic wet etching process) that implements an etchant that includes hydrofluoric acid (HF), ammonia ($NH_3$), nitrogen trifluoride ($NF_3$), other suitable etchants, or combinations thereof. Since the sacrificial spacers 224 is in contact with sidewalls of the inner spacers 234 (FIG. 21C), after the sacrificial spacers 224 are removed, the inner spacers 234 are exposed and thereby subsequently removed. In the illustrated embodiment, the sacrificial spacers 224 and the inner spacers 234 have the same material composition and can be removed by the same etchant. In some other embodiments, the sacrificial spacers 224 and the inner spacers 234 have different material compositions and can be removed by different etchants. Removing the sacrificial spacers 224 and the inner spacers 234 releases the space occupied by the sacrificial spacers 224 and the inner spacers 234, thereby forming an air gap 280. The exposed top surface 270 is denoted as opening 270 when the air gap 280 is formed.

Figure 22A:
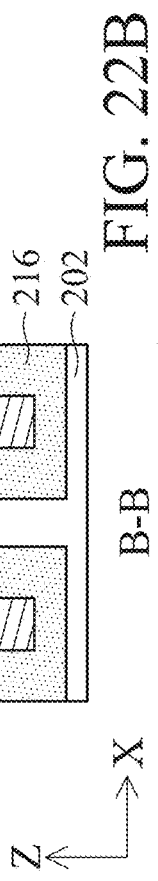
Figure 22B:
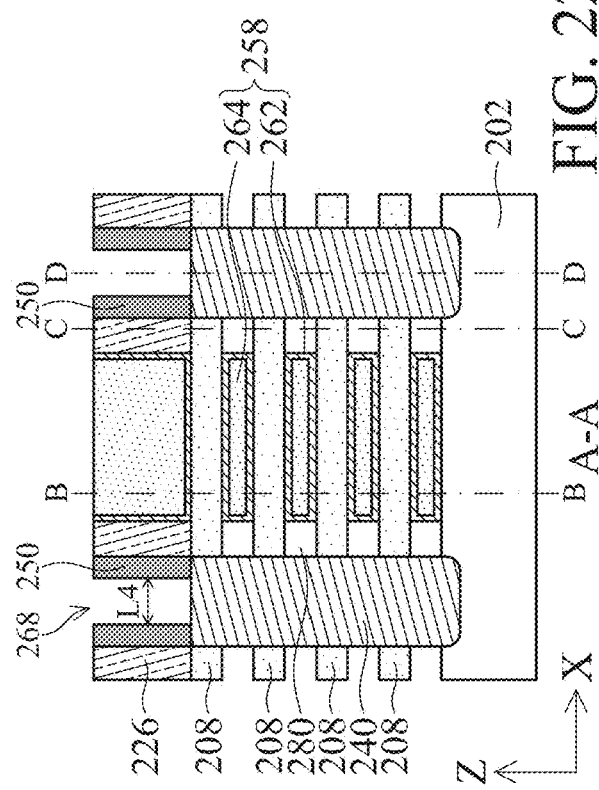
Figure 22C:
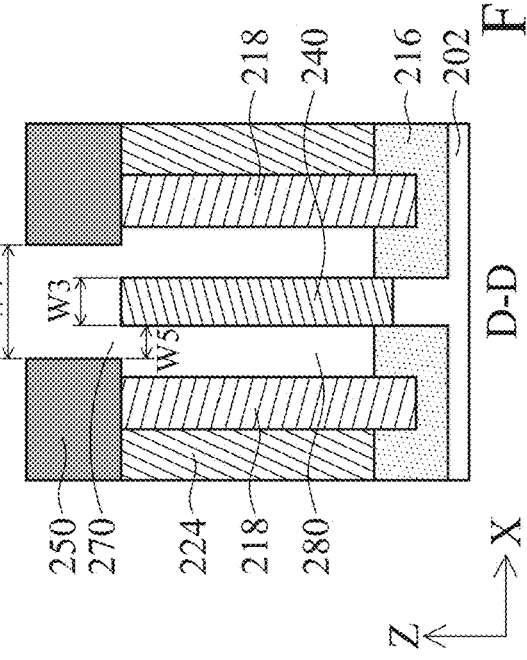
Figure 22D:
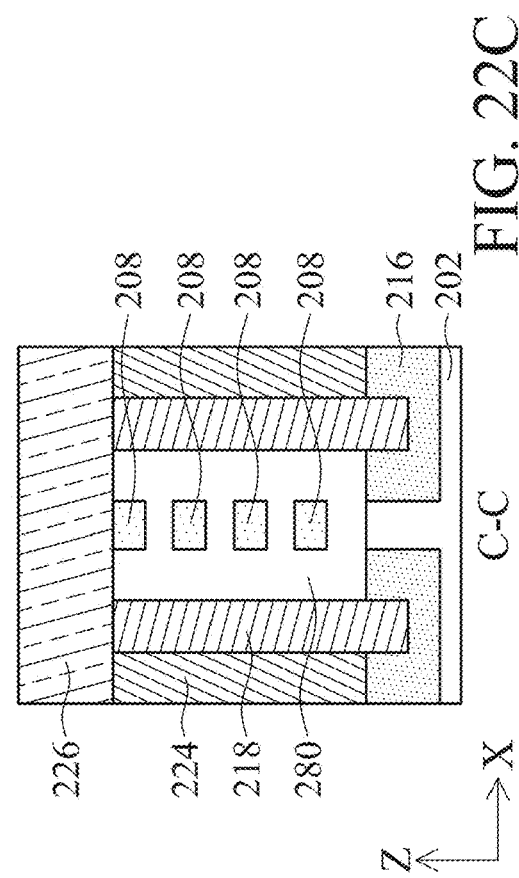
Figure 27B:
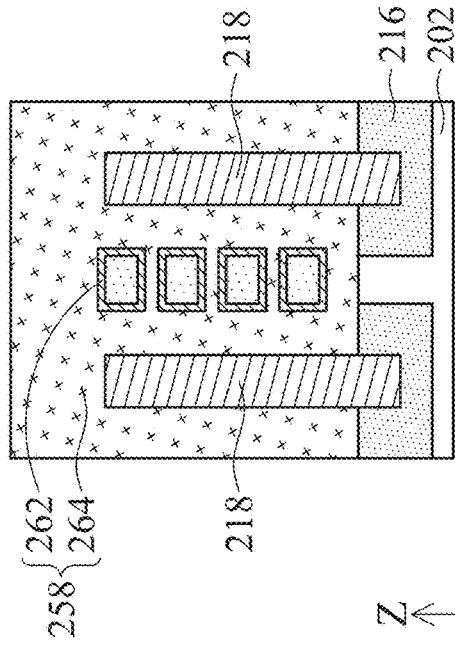
Figure 27D:
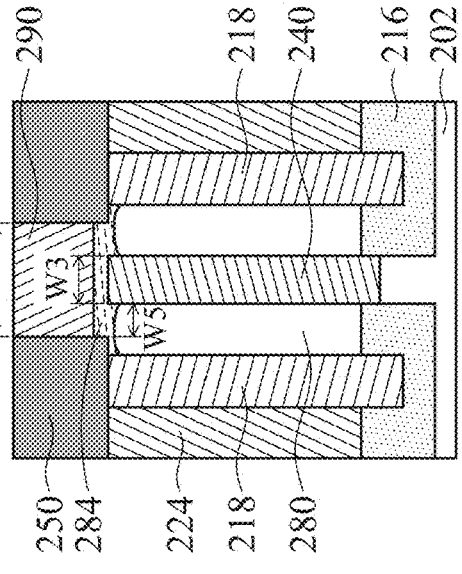
Figure 27A:
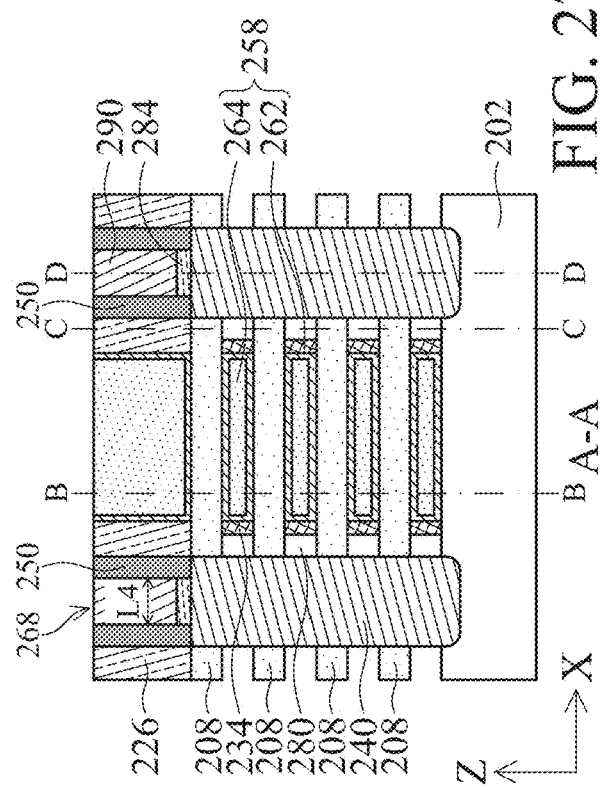
Figure 27C:
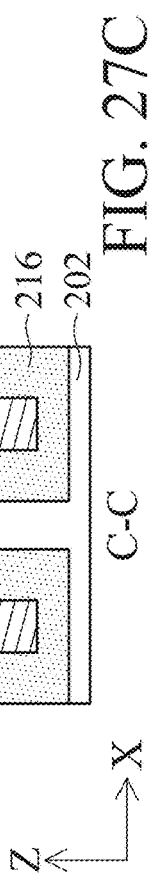

As used herein, the term "air gap" is used to describe a void defined by surrounding substantive features, where a void may contain air, nitrogen, ambient gases, gaseous chemicals used in previous or current processes, or combinations thereof. In the illustrated embodiment, the air gap 280 is continuous. In the region between two adjacent semiconductor wires 208, the air gap 280 fully surrounds a portion of the epitaxial S/D feature 240. In the region directly under the gate sidewall spacer 226, the air gap 280 fully surrounds some of the semiconductor wires 208 (the topmost semiconductor wire 208 may have only three surfaces exposed to the air gap 280, as shown in FIG. 22C). Since the inner spacers 234 are removed, the gate structure 258 directly faces (in the y-direction) the epitaxial S/D feature 240 through the air gap 280. In the illustrated embodiment, the gate dielectric layer 262 of the gate structure 258 directly faces (in the y-direction) the epitaxial S/D feature 240 through the air gap 280. The two dielectric fins 218 also have two opposing sidewalls directly facing (in the x-direction) each other through the air gap 280. The air gap 280 reduces the stray capacitance in the GAA device.

At operation 138, the method 100 (FIG. 1C) forms a silicide layer 284 over the epitaxial S/D features 240, which also caps the air gap 280, as shown in FIGS. 23A-D. The silicide layer 284 is laterally larger (in the x-direction) than the width W3 of the epitaxial S/D features 240. As discussed above, the opening 270 of the air gap 280 is configured to accommodate the formation of a silicide layer to fully cap the air gap 280. In many embodiments, the silicide layer 284 includes nickel silicide, cobalt silicide, tungsten silicide, tantalum silicide, titanium silicide, platinum silicide, erbium silicide, palladium silicide, other suitable silicide, or combinations thereof. The silicide layer 284 is formed by a suitable method. In one example, a metal layer (e.g., nickel) may be deposited over the semiconductor device 200 by a deposition process such as CVD, ALD, PVD, other suitable processes, or combinations thereof. In the illustrated embodiment, operation 138 deposits Titanium in a PVD process. Then, the semiconductor device 200 is annealed to allow the metal layer and the semiconductor materials of the epitaxial S/D features 240 to react and form the silicide layer 284. Thereafter, the un-reacted metal layer is removed, leaving the silicide layer 284 over the epitaxial S/D features 240. In some examples, the silicide layer 284 is formed to have a thickness of about 2 nm to about 3 nm. The silicide layer 284 may be disposed not only on the top surface of the epitaxial S/D features 240 but also at least on bottom surfaces of the ILD layer 250 exposed in the air gap 280, as shown in FIG. 23D. After the capping process, the air gap 280 vertically extends from the isolation feature 216 to the silicide layer 284.

At operation 140, the method 100 (FIG. 1C) forms S/D contacts 290 over the silicide layer 284 to be in electrical contact with corresponding epitaxial S/D features 240, as shown in FIGS. 24A-D. Each S/D contact 290 may include one or more conductive layers and may be formed using any suitable methods such as ALD, CVD, PVD, plating, and/or other suitable processes. In some embodiments, each S/D contact 290 includes a seed metal layer and a fill metal layer. In various embodiments, the seed metal layer includes cobalt (Co), tungsten (W), ruthenium (Ru), nickel (Ni), other suitable metals, or combinations thereof. The fill metal layer may include copper (Cu), tungsten (W), aluminum (Al), cobalt (Co), other suitable materials, or combinations thereof.

The method 100 after operation 140 may perform additional processing steps. For example, additional vertical interconnect features such as vias, horizontal interconnect features such as lines, and/or multilayer interconnect features such as metal layers and interlayer dielectrics can be formed over the semiconductor device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

FIGS. 25A-D illustrate another embodiment of the semiconductor device 200. Compared with FIGS. 24A-D, one difference is that the silicide layer 284 does not fully cover a bottom surface of the ILD layer 250 that is exposed in the air gap 280 (FIG. 25D). Therefore, the air gap 280 still exposes a portion of the bottom surface of the ILD layer 250. FIGS. 26A-D illustrate yet another embodiment of the device 200. As discussed above, the dielectric fins 218 may protrude from the substrate 202 in some embodiments. Compared with FIGS. 24A-D, one difference is that the dielectric fins are in contact with the substrate 202. FIGS. 27A-D illustrate yet another embodiment of the semiconductor device 200. Compared with FIGS. 24A-D, one difference is that a portion of the inner spacers 234 is remained in the cavities 232 (now a portion of the air gap 280), because of a small volume of the cavity. The remaining portion of the inner spacers 234 seals the gate structure 258 from directly exposing in the air gap 280.

Although not intended to be limiting, one or more embodiments of the present disclosure provide many benefits to a semiconductor device and the formation thereof. The present disclosure provides methods of forming a GAA device with laterally confined epitaxial S/D features and air gap as inner spacer, where the air gap further surrounds the epitaxial S/D features and channel members of the GAA device. Accordingly, this provides a benefit of reducing the $C_{gd}$ (gate-to-drain capacitance) and $C_{gs}$ (gate-to-source capacitance) of the device. In some embodiments of the present disclosure, this provides a benefit of reducing the $C_{eff}$ (effective capacitance) of the device without obvious penalty to the $I_{eff}$ (effective current). Therefore, the speed of the circuit could be further improved.

In one exemplary aspect, the present disclosure is directed to a semiconductor device. The semiconductor device includes a substrate; semiconductor wires disposed over the substrate; a gate structure wrapping around each of the semiconductor wires; and an epitaxial source/drain (S/D) feature in contact with the semiconductor wires, wherein a portion of the epitaxial S/D feature is horizontally surrounded by an air gap. In some embodiments, the gate structure directly faces the portion of the epitaxial S/D feature through the air gap. In some embodiments, the semiconductor device further includes an inner spacer feature disposed on the gate structure, wherein the inner spacer feature directly faces the portion of the epitaxial S/D feature through the air gap. In some embodiments, at least one of the semiconductor wires has a portion vertically surrounded by the air gap. In some embodiments, the semiconductor device further includes a gate spacer disposed on sidewalls of the gate structure, wherein the portion of the at least one of the semiconductor wires is directly under the gate spacer. In some embodiments, the semiconductor device further includes an isolation feature disposed on the substrate and a silicide layer disposed on the epitaxial S/D feature, wherein the air gap vertically extends from the isolation feature to the silicide layer. In some embodiments, the semiconductor wires extend lengthwise along a first direction; the semiconductor wires have a first width along a second direction perpendicular to the first direction; the portion of the epitaxial S/D feature has a second width along the second direction; and the first and second width are substantially equal. In some embodiments, the semiconductor device further includes a first dielectric fin and a second dielectric fin, wherein the semiconductor wires interpose between the first and second dielectric fins. In some embodiments, the air gap horizontally extends from a first sidewall of the first dielectric fin to a second sidewall of the second dielectric fin. In some embodiments, a bottom surface of the epitaxial S/D feature is above bottom surfaces of the first and second dielectric fins. In some embodiments, the first and second dielectric fins are in contact with the substrate.

In another exemplary aspect, the present disclosure is directed to a multi-gate semiconductor device. The multi-gate semiconductor device includes a substrate; semiconductor wires vertically stacked over each other and above the substrate; a gate structure disposed over a channel region of the semiconductor wires and surrounding each of the semiconductor wires; an epitaxial source/drain (S/D) feature adjacent the semiconductor wires; and a first dielectric fin and a second dielectric fin disposed over the substrate, wherein the first and second dielectric fins sandwich the semiconductor wires and the epitaxial S/D feature. In some embodiments, a width of the epitaxial S/D feature is not larger than a width of the semiconductor wires. In some embodiments, the first dielectric fin has a first sidewall directly faces the epitaxial S/D feature and the second dielectric fin has a second sidewall directly faces the epitaxial S/D feature. In some embodiments, the first sidewall of the first dielectric fin is spaced from the epitaxial S/D feature and the second sidewall of the second dielectric fin is spaced from the epitaxial S/D feature. In some embodiments, the gate structure, the epitaxial S/D feature, and the first and second dielectric fins jointly define a void that surrounds the epitaxial S/D feature. In some embodiments, the multi-gate semiconductor device further includes a gate spacer disposed over sidewalls of the gate structure, wherein a portion of the semiconductor wires directly under the gate spacer is surrounded by the void.

In another exemplary aspect, the present disclosure is directed to a method of manufacturing a semiconductor device. The method includes forming a semiconductor fin protruding from a substrate, the semiconductor fin having a channel region and a source/drain (S/D) region; forming first and second dielectric fins sandwiching the semiconductor fin; forming a first gate stack over the semiconductor fin in the channel region; depositing sacrificial spacers in the S/D region and between the first and second dielectric fins; recess the semiconductor fin in the S/D region, resulting in a trench between the sacrificial spacers; forming an S/D epitaxial layer in the trench; and removing the sacrificial spacers, resulting in an air gap between the S/D epitaxial layer and the first dielectric fin and between the S/D epitaxial layer and the second dielectric fin. In some embodiments, where the semiconductor fin includes a stack of alternating first semiconductor layers and second semiconductor layers, the method further includes removing the first gate stack, resulting in a gate trench; removing the second semiconductor layers from the gate trench; and forming a second gate stack wrapping the first semiconductor layers in the gate trench. In some embodiments, the method further includes forming a silicide layer over the S/D epitaxial layer, the silicide layer capping the air gap.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A semiconductor device, comprising:
a substrate;
first and second dielectric fins disposed above the substrate;
a semiconductor channel layer sandwiched between the first and second dielectric fins;
a gate structure engaging the semiconductor channel layer;

a source/drain (S/D) feature abutting the semiconductor channel layer and sandwiched between the first and second dielectric fins; and an air gap sandwiched between the first and second dielectric fins, wherein the air gap exposes a first sidewall of the S/D feature facing the first dielectric fin and a second sidewall of the S/D feature facing the second dielectric fin.

2. The semiconductor device of claim 1, further comprising:
a silicide feature atop the S/D feature, wherein the silicide feature has a larger width than the S/D feature.

3. The semiconductor device of claim 1, further comprising:
an isolation feature disposed on sidewalls of each of the first and second dielectric fins, wherein the isolation feature separates each of the first and second dielectric fins from contacting the substrate.

4. The semiconductor device of claim 1, further comprising:
an isolation feature disposed on sidewalls of each of the first and second dielectric fins, wherein each of the first and second dielectric fins is in contact with the substrate.

5. The semiconductor device of claim 1, further comprising:
a gate sidewall spacer disposed on sidewalls of the gate structure, wherein a portion of the semiconductor channel layer directly under the gate sidewall spacer is fully surrounded by the air gap in a cross-sectional plane perpendicular to a top surface of the substrate.

6. The semiconductor device of claim 1, further comprising:
an interlayer dielectric layer disposed above the S/D feature, wherein the air gap exposes a bottom surface of the interlayer dielectric layer.

7. The semiconductor device of claim 1, wherein the air gap extends horizontally from the gate structure to the S/D feature.

8. The semiconductor device of claim 1, wherein the air gap fully surrounds a portion of the S/D feature in a horizontal plane parallel to a top surface of the substrate.

9. The semiconductor device of claim 1, wherein the semiconductor channel layer is suspended above the substrate.

10. A semiconductor device, comprising:
a substrate;
first and second dielectric features disposed over the substrate, each of the first and second dielectric features having a first sidewall and a second sidewall;
a dielectric layer disposed on the first sidewall of the first dielectric feature and the second sidewall of the second dielectric feature, wherein the second sidewall of the first dielectric feature directly faces the first sidewall of the second dielectric feature; and
an epitaxial feature sandwiched between the second sidewall of the first dielectric feature and the first sidewall of the second dielectric feature.

11. The semiconductor device of claim 10, further comprising:
a semiconductor layer abutting the epitaxial feature; and
a gate structure engaging the semiconductor layer.

12. The semiconductor device of claim 11, wherein the semiconductor layer is disposed between the first and second dielectric features.

13. The semiconductor device of claim 11, further comprising:
a gate sidewall spacer disposed on sidewalls of the gate structure, wherein the gate sidewall spacer is in contact with top surfaces of the first and second dielectric features and the dielectric layer.

14. The semiconductor device of claim 10, further comprising:
interlayer dielectric layer disposed above the first and second dielectric features and the dielectric layer; and
a silicide feature disposed above the epitaxial feature, wherein a portion of the silicide feature is directly under the interlayer dielectric layer.

15. The semiconductor device of claim 10, wherein the epitaxial feature is spaced from the second sidewall of the first dielectric feature and the first sidewall of the second dielectric feature by an air gap.

16. A method of manufacturing a semiconductor device, comprising:
forming a semiconductor fin protruding from a substrate, the semiconductor fin having a channel region and a source/drain (S/D) region;
forming first and second dielectric fins sandwiching the semiconductor fin;
depositing a first dielectric layer filling space between the semiconductor fin and the first and second dielectric fins;
recessing the semiconductor fin in the S/D region, resulting in a trench exposing sidewalls of the first dielectric layer;
forming an epitaxial feature in the trench;
depositing a second dielectric layer over the epitaxial feature and the first dielectric layer;
patterning the second dielectric layer, thereby forming an opening in the second dielectric layer, the opening exposing the epitaxial feature and the first dielectric layer; and
partially removing the first dielectric layer from the opening.

17. The method of claim 16, wherein the partially removing of the first dielectric layer results in an air gap between the epitaxial feature and the first dielectric fin and between the epitaxial feature and the second dielectric fin.

18. The method of claim 16, wherein a portion of a top surface of the first dielectric layer exposed by the opening has a width about one eighth to about one third of a width of the epitaxial feature.

19. The method of claim 16, further comprising:
forming a gate structure over the channel region;
forming a spacer feature between the gate structure and the epitaxial feature; and
etching the spacer feature through the opening.

20. The method of claim 16, further comprising:
forming a conductive feature in the opening, wherein a portion of the conductive feature extends directly under a bottom surface of the second dielectric layer.

* * * * *